US007103824B2

(12) United States Patent
Halford

(10) Patent No.: US 7,103,824 B2
(45) Date of Patent: Sep. 5, 2006

(54) MULTI-DIMENSIONAL DATA PROTECTION AND MIRRORING METHOD FOR MICRO LEVEL DATA

(76) Inventor: Robert Halford, 18703 67th Ave., Chippewa Falls, WI (US) 54729

( * ) Notice: Subject to any disclaimer, the term of this patent is extended or adjusted under 35 U.S.C. 154(b) by 474 days.

(21) Appl. No.: 10/624,208

(22) Filed: Jul. 22, 2003

(65) Prior Publication Data

US 2004/0123223 A1 Jun. 24, 2004

Related U.S. Application Data

(60) Provisional application No. 60/460,545, filed on Apr. 4, 2003, provisional application No. 60/399,635, filed on Jul. 29, 2002.

(51) Int. Cl.
*H03M 13/15* (2006.01)
(52) U.S. Cl. ...................... 714/759; 714/781
(58) Field of Classification Search ................ 714/759, 714/781; H03M 13/15
See application file for complete search history.

(56) References Cited

U.S. PATENT DOCUMENTS

| 3,868,632 A | 2/1975 | Hong et al. |
| 4,513,420 A | 4/1985 | Collins et al. |
| 5,128,810 A | 7/1992 | Halford |
| 5,271,012 A | 12/1993 | Blaum et al. |
| 5,283,791 A | 2/1994 | Halford |

(Continued)

FOREIGN PATENT DOCUMENTS

EP 563491 A1 * 10/1993

OTHER PUBLICATIONS

David Mazières; V22.0480-005 lecture notes, No. 13 "Error detection/Quiz review"; available at www.scs.stanford.edu/nyu/04sp/notes/l13.pdf.*

(Continued)

*Primary Examiner*—R. Stephen Dildine
(74) *Attorney, Agent, or Firm*—Faegre & Benson LLP

(57) ABSTRACT

The invention discloses a data validation, mirroring and error/erasure correction method for the dispersal and protection of one and two-dimensional data at the micro level for computer, communication and storage systems. Each of 256 possible 8-bit data bytes are mirrored with a unique 8-bit ECC byte. The ECC enables 8-bit burst and 4-bit random error detection plus 2-bit random error correction for each encoded data byte. With the data byte and ECC byte configured into a 4 bit×4 bit codeword array and dispersed in either row, column or both dimensions the method can perform dual 4-bit row and column erasure recovery. It is shown that for each codeword there are 12 possible combinations of row and column elements called couplets capable of mirroring the data byte. These byte level micro-mirrors outperform conventional mirroring in that each byte and its ECC mirror can self-detect and self-correct random errors and can recover all dual erasure combinations over four elements. Encoding at the byte quanta level maximizes application flexibility. Also disclosed are fast encode, decode and reconstruction methods via boolean logic, processor instructions and software table look-up with the intent to run at line and application speeds. The new error control method can augment ARQ algorithms and bring resiliency to system fabrics including routers and links previously limited to the recovery of transient errors. Image storage and storage over arrays of static devices can benefit from the two-dimensional capabilities. Applications with critical data integrity requirements can utilize the method for end-to-end protection and validation. An extra ECC byte per codeword extends both the resiliency and dimensionality.

34 Claims, 24 Drawing Sheets

U.S. PATENT DOCUMENTS

| | | |
|---|---|---|
| 5,347,637 A | 9/1994 | Halford |
| 5,485,474 A | 1/1996 | Rabin |
| 5,579,475 A | 11/1996 | Blaum et al. |
| 6,088,330 A | 7/2000 | Bruck et al. |
| 6,128,277 A | 10/2000 | Bruck et al. |
| 6,138,125 A | 10/2000 | DeMoss |
| 6,158,026 A | 12/2000 | Kawahara |
| 6,360,348 B1 | 3/2002 | Yang |
| 6,557,123 B1 | 4/2003 | Wiencko, Jr. et al. |
| 2004/0114484 A1* | 6/2004 | Sako et al. .............. 369/53.22 |

OTHER PUBLICATIONS

Dariush Dabiri and Ian F. Blake; Fast Parallel Algorithms forDecoding Reed-Solomon Codes Based on Remainder Polynomials; IEEE Transactions on Information Theory, vol. 41, No. 4, Jul. 1995; pp. 873-885.*

Elwyn Belekamp, *Algebraic Coding Theory*, 1968, pp. 90-91, 139-141, and 144 (*book*).

Patterson et al., University of Califronia—Berkeley, *A case for Redundant Array of Inexpensive Disks* (*RAID*), 1987, (paper).

* cited by examiner

Codeword in binary serial form or parallel 16-bit form

Codeword in binary byte form

Codeword in binary array form showing row and column erasure elements

```
            120
 [Di]   d0d1d2d3  s    {hexadecimal row elements}
        d4d5d6d7  t
 [Ei]   e0e1e2e3  u
        e4e5e6e7  v
        --------
         w x y z       {hexadecimal column elements}
```

Figure 1C

Micro_Mirrors
12 per codeword

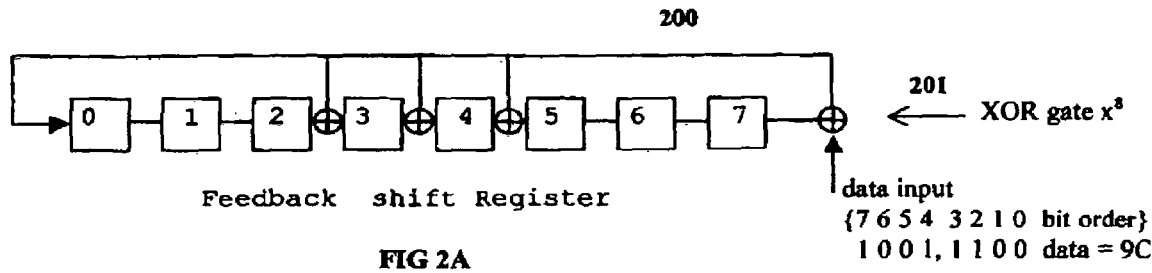

Feedback shift Register

FIG 2A

201 ← XOR gate $x^8$ data input
{7 6 5 4 3 2 1 0 bit order}
1 0 0 1, 1 1 0 0 data = 9C

| | | | | | | | | |
|---|---|---|---|---|---|---|---|---|
| 0 | 0 | 0 | 0 | 0 | 0 | 0 | 0 | |
| 1 | 0 | 0 | 1 | 1 | 1 | 0 | 0 | results after 1 shift |
| 0 | 1 | 0 | 0 | 1 | 1 | 1 | 0 | results after 2 shifts |
| 0 | 0 | 1 | 0 | 0 | 1 | 1 | 1 | results after 3 shifts |
| 0 | 0 | 0 | 1 | 0 | 0 | 1 | 1 | results after 4 shifts |
| 0 | 0 | 0 | 0 | 1 | 0 | 0 | 1 | results after 5 shifts |
| 0 | 0 | 0 | 0 | 0 | 1 | 0 | 0 | results after 6 shifts |
| 0 | 0 | 0 | 0 | 0 | 0 | 1 | 0 | results after 7 shifts |
| 0 | 0 | 0 | 0 | 0 | 0 | 0 | 1 | results after 8 shifts, ECC = 80 |

| | per example | |
|---|---|---|
| e0 = d0 + d3 + d4 + d5 + d6 | 0 + 1 + 1 + 0 + 0 | = 0 |
| e1 = d1 + d4 + d5 + d6 + d7 | 0 + 1 + 0 + 0 + 1 | = 0 |
| e2 = d2 + d5 + d6 + d7 | 1 + 0 + 0 + 1 | = 0 |
| e3 = d0 + d4 + d5 + d7 | 0 + 1 + 0 + 1 | = 0 |
| e4 = d0 + d1 + d3 + d4 | 0 + 0 + 1 + 1 | = 0 |
| e5 = d0 + d1 + d2 + d3 + d6 | 0 + 0 + 1 + 1 + 0 | = 0 |
| e6 = d1 + d2 + d3 + d4 + d7 | 0 + 1 + 1 + 1 + 1 | = 0 |
| e7 = d2 + d3 + d4 + d5 | 1 + 1 + 1 + 0 | = 1 |
| | ECC = 80 for data byte 9C | |

| | per example | |
|---|---|---|
| d0 = e2 + e3 + e4 + e5 | 0 + 0 + 0 + 0 | = 0 |
| d1 = e0 + e3 + e4 + e5 + e6 | 0 + 0 + 0 + 0 + 0 | = 0 |
| d2 = e1 + e4 + e5 + e6 + e7 | 0 + 0 + 0 + 0 + 1 | = 1 |
| d3 = e3 + e4 + e6 + e7 | 0 + 0 + 0 + 1 | = 1 |
| d4 = e0 + e2 + e3 + e7 | 0 + 0 + 0 + 1 | = 1 |
| d5 = e0 + e1 + e2 + e5 | 0 + 0 + 0 + 0 | = 0 |
| d6 = e0 + e1 + e2 + e3 + e6 | 0 + 0 + 0 + 0 + 0 | = 0 |
| d7 = e1 + e2 + e3 + e4 + e7 | 0 + 0 + 0 + 0 + 1 | = 1 |
| | data byte = 9C for ECC = 80 | |

FIG 2D

```
         600
byte 8 7 6 5 4 3 2 1 0
     c d d d d d d d
     c d d d d d d d
     c d d d d d d d
     c d d d d d d d
     c d d d d d d d
     c d d d d d d d
     c d d d d d d d
     c d d d d d d d
```

Data Flow >>>>

```
                              910                              900
              byte  8 7 6 5 4 3 2 1 0         8 7 6 5 4 3 2 1 0
         bit
         2⁰         c e e e e e e e 1         c d d d d d d d 1
         2¹         c e e e e e e e 1         c d d d d d d d 0
         2²         c e e e e e e e 1         c d d d d d d d 0
         2³         c e e e e e e e 0 [E]     c d d d d d d d 0 [D]
         2⁴         c e e e e e e e 1         c d d d d d d d 0
         2⁵         c e e e e e e e 1         c d d d d d d d 0
         2⁶         c e e e e e e e 1         c d d d d d d d 0
         2⁷         c e e e e e e e 0         c d d d d d d d 1
                                 <<< NACK                   <<< ACK
                           Data Flow  >>>>
```

Figure 9

```
                              1010                             1000
              byte  8 7 6 5 4 3 2 1 0         8 7 6 5 4 3 2 1 0
         bit
         2⁰         c e e e e e e e 1         c d d d d d d d 1
         2¹         c e e e e e e e 1         c d d d d d d d 0
         2²         c e e e e e e e 1         c d d d d d d d 0
         2³         c e e e e e e e 0 [E]     c d d d d d d d 0 [D]
         2⁴         c e e e e e e e 1         c d d d d d d d 0
         2⁵         c e e e e e e e 0         c d d d d d d d 1
         2⁶         c e e e e e e e 1         c d d d d d d d 0
         2⁷         c e e e e e e e 0         c d d d d d d d 1
                                 <<< NACK                   <<< ACK
                           Data Flow  >>>>
```

Figure 10

|  | ECC | Data |
|---|---|---|
| The correction algorithm | | |
| Data byte 0 input in error is | | 1 0 1 0 0 0 0 1 = A1 hex. |
| The ECC for A1 is F8 | 1 1 1 1 1 0 0 0 = F8 hex. | |
| ECC byte 0 input in error is | 0 1 0 1 0 1 1 1 = 57 hex. | |
| The ECC syndrome | 1 0 1 0 1 1 1 1 = AF hex. | |
| E.P. from Table 5 = d5 & e5 | 0 0 1 0 0 0 0 0 = e5 | and  0 0 1 0 0 0 0 0 = d5 |
| After corrections data = 81 hex. | 0 1 1 1 0 1 1 1 = 77 hex. | and  1 0 0 0 0 0 0 1 = 81 hex. |

Data Flow >>>              <<< NACK                                      <<< ACK

Data Flow >>>              <<< NACK                                      <<< ACK

FIG 14
```

Begin with Byte 00
Transmitted
s00t00 = 18h (data = ts = 81h)                    u00v00 = 77h (ECC = vu = 77h)
Received
s00t00 = 1Ah (data = ts = A1h)                    u00v00 = 75h (ECC = vu = 57h)
So correction proceeds exactly as before in Figure 8 for byte 00.
All 32 bytes are assembled and corrected then verified via the CRC checkcode comparison.

|  | ECC | Data |
|---|---|---|
| Data byte 00 input in error is |  | 1 0 1 0 0 0 0 1 = A1 hex. |
| The ECC for A1 is F8 | 1 1 1 1 1 0 0 0 = F8 hex. |  |
| ECC byte 00 input in error is | 0 1 0 1 0 1 1 1 = 57 hex. |  |
| The ECC syndrome | 1 0 1 0 1 1 1 1 = AF hex. |  |
| E.P. from Table 1 = d5 & e5 | 0 0 1 0 0 0 0 0 = e5   and 0 0 1 0 0 0 0 0 = d5 |  |
| After corrections data = 81 hex. | 0 1 1 1 0 1 1 1 = 77 hex. and 1 0 0 0 0 0 0 1 = 81 hex. |  |

FIG 14A

|   | 0 | 1 | 2 | 3 | | 508 | 509 | 510 | 511 | 0 | | 7 |
|---|---|---|---|---|---|---|---|---|---|---|---|---|
| 0 | $d^0d^1d^2d^3$ $d^4d^5d^6d^7$ $e^0e^1e^2e^3$ $e^4e^5e^6e^7$ | $d^0d^1d^2d^3$ $d^4d^5d^6d^7$ $e^0e^1e^2e^3$ $e^4e^5e^6e^7$ | $d^0d^1d^2d^3$ $d^4d^5d^6d^7$ $e^0e^1e^2e^3$ $e^4e^5e^6e^7$ | $d^0d^1d^2d^3$ $d^4d^5d^6d^7$ $e^0e^1e^2e^3$ $e^4e^5e^6e^7$ | | $d^0d^1d^2d^3$ $d^4d^5d^6d^7$ $e^0e^1e^2e^3$ $e^4e^5e^6e^7$ | $d^0d^1d^2d^3$ $d^4d^5d^6d^7$ $e^0e^1e^2e^3$ $e^4e^5e^6e^7$ | $d^0d^1d^2d^3$ $d^4d^5d^6d^7$ $e^0e^1e^2e^3$ $e^4e^5e^6e^7$ | $d^0d^1d^2d^3$ $d^4d^5d^6d^7$ $e^0e^1e^2e^3$ $e^4e^5e^6e^7$ | $c^0c^1c^2c^3$ $c^0c^1c^2c^3$ $c^0c^1c^2c^3$ $c^0c^1c^2c^3$ | | $c^{28}c^{29}c^{30}c^{31}$ $c^{28}c^{29}c^{30}c^{31}$ $c^{28}c^{29}c^{30}c^{31}$ $c^{28}c^{29}c^{30}c^{31}$ |
| 1 | $d^0d^1d^2d^3$ $d^4d^5d^6d^7$ $e^0e^1e^2e^3$ $e^4e^5e^6e^7$ | $d^0d^1d^2d^3$ $d^4d^5d^6d^7$ $e^0e^1e^2e^3$ $e^4e^5e^6e^7$ | $d^0d^1d^2d^3$ $d^4d^5d^6d^7$ $e^0e^1e^2e^3$ $e^4e^5e^6e^7$ | $d^0d^1d^2d^3$ $d^4d^5d^6d^7$ $e^0e^1e^2e^3$ $e^4e^5e^6e^7$ | | $d^0d^1d^2d^3$ $d^4d^5d^6d^7$ $e^0e^1e^2e^3$ $e^4e^5e^6e^7$ | $d^0d^1d^2d^3$ $d^4d^5d^6d^7$ $e^0e^1e^2e^3$ $e^4e^5e^6e^7$ | $d^0d^1d^2d^3$ $d^4d^5d^6d^7$ $e^0e^1e^2e^3$ $e^4e^5e^6e^7$ | $d^0d^1d^2d^3$ $d^4d^5d^6d^7$ $e^0e^1e^2e^3$ $e^4e^5e^6e^7$ | $c^0c^1c^2c^3$ $c^0c^1c^2c^3$ $c^0c^1c^2c^3$ $c^0c^1c^2c^3$ | | $c^{28}c^{29}c^{30}c^{31}$ $c^{28}c^{29}c^{30}c^{31}$ $c^{28}c^{29}c^{30}c^{31}$ $c^{28}c^{29}c^{30}c^{31}$ |
| 2 | $d^0d^1d^2d^3$ $d^4d^5d^6d^7$ $e^0e^1e^2e^3$ $e^4e^5e^6e^7$ | $d^0d^1d^2d^3$ $d^4d^5d^6d^7$ $e^0e^1e^2e^3$ $e^4e^5e^6e^7$ | $d^0d^1d^2d^3$ $d^4d^5d^6d^7$ $e^0e^1e^2e^3$ $e^4e^5e^6e^7$ | $d^0d^1d^2d^3$ $d^4d^5d^6d^7$ $e^0e^1e^2e^3$ $e^4e^5e^6e^7$ | | $d^0d^1d^2d^3$ $d^4d^5d^6d^7$ $e^0e^1e^2e^3$ $e^4e^5e^6e^7$ | $d^0d^1d^2d^3$ $d^4d^5d^6d^7$ $e^0e^1e^2e^3$ $e^4e^5e^6e^7$ | $d^0d^1d^2d^3$ $d^4d^5d^6d^7$ $e^0e^1e^2e^3$ $e^4e^5e^6e^7$ | $d^0d^1d^2d^3$ $d^4d^5d^6d^7$ $e^0e^1e^2e^3$ $e^4e^5e^6e^7$ | $c^0c^1c^2c^3$ $c^0c^1c^2c^3$ $c^0c^1c^2c^3$ $c^0c^1c^2c^3$ | | $c^{28}c^{29}c^{30}c^{31}$ $c^{28}c^{29}c^{30}c^{31}$ $c^{28}c^{29}c^{30}c^{31}$ $c^{28}c^{29}c^{30}c^{31}$ |
| 3 | $d^0d^1d^2d^3$ $d^4d^5d^6d^7$ $e^0e^1e^2e^3$ $e^4e^5e^6e^7$ | $d^0d^1d^2d^3$ $d^4d^5d^6d^7$ $e^0e^1e^2e^3$ $e^4e^5e^6e^7$ | $d^0d^1d^2d^3$ $d^4d^5d^6d^7$ $e^0e^1e^2e^3$ $e^4e^5e^6e^7$ | $d^0d^1d^2d^3$ $d^4d^5d^6d^7$ $e^0e^1e^2e^3$ $e^4e^5e^6e^7$ | | $d^0d^1d^2d^3$ $d^4d^5d^6d^7$ $e^0e^1e^2e^3$ $e^4e^5e^6e^7$ | $d^0d^1d^2d^3$ $d^4d^5d^6d^7$ $e^0e^1e^2e^3$ $e^4e^5e^6e^7$ | $d^0d^1d^2d^3$ $d^4d^5d^6d^7$ $e^0e^1e^2e^3$ $e^4e^5e^6e^7$ | $d^0d^1d^2d^3$ $d^4d^5d^6d^7$ $e^0e^1e^2e^3$ $e^4e^5e^6e^7$ | $c^0c^1c^2c^3$ $c^0c^1c^2c^3$ $c^0c^1c^2c^3$ $c^0c^1c^2c^3$ | | $c^{28}c^{29}c^{30}c^{31}$ $c^{28}c^{29}c^{30}c^{31}$ $c^{28}c^{29}c^{30}c^{31}$ $c^{28}c^{29}c^{30}c^{31}$ |
| ⋮ | | | | | | | | | | | | |
| 509 | $d^0d^1d^2d^3$ $d^4d^5d^6d^7$ $e^0e^1e^2e^3$ $e^4e^5e^6e^7$ | $d^0d^1d^2d^3$ $d^4d^5d^6d^7$ $e^0e^1e^2e^3$ $e^4e^5e^6e^7$ | $d^0d^1d^2d^3$ $d^4d^5d^6d^7$ $e^0e^1e^2e^3$ $e^4e^5e^6e^7$ | $d^0d^1d^2d^3$ $d^4d^5d^6d^7$ $e^0e^1e^2e^3$ $e^4e^5e^6e^7$ | | $d^0d^1d^2d^3$ $d^4d^5d^6d^7$ $e^0e^1e^2e^3$ $e^4e^5e^6e^7$ | $d^0d^1d^2d^3$ $d^4d^5d^6d^7$ $e^0e^1e^2e^3$ $e^4e^5e^6e^7$ | $d^0d^1d^2d^3$ $d^4d^5d^6d^7$ $e^0e^1e^2e^3$ $e^4e^5e^6e^7$ | $d^0d^1d^2d^3$ $d^4d^5d^6d^7$ $e^0e^1e^2e^3$ $e^4e^5e^6e^7$ | $c^0c^1c^2c^3$ $c^0c^1c^2c^3$ $c^0c^1c^2c^3$ $c^0c^1c^2c^3$ | | $c^{28}c^{29}c^{30}c^{31}$ $c^{28}c^{29}c^{30}c^{31}$ $c^{28}c^{29}c^{30}c^{31}$ $c^{28}c^{29}c^{30}c^{31}$ |
| 510 | $d^0d^1d^2d^3$ $d^4d^5d^6d^7$ $e^0e^1e^2e^3$ $e^4e^5e^6e^7$ | $d^0d^1d^2d^3$ $d^4d^5d^6d^7$ $e^0e^1e^2e^3$ $e^4e^5e^6e^7$ | $d^0d^1d^2d^3$ $d^4d^5d^6d^7$ $e^0e^1e^2e^3$ $e^4e^5e^6e^7$ | $d^0d^1d^2d^3$ $d^4d^5d^6d^7$ $e^0e^1e^2e^3$ $e^4e^5e^6e^7$ | | $d^0d^1d^2d^3$ $d^4d^5d^6d^7$ $e^0e^1e^2e^3$ $e^4e^5e^6e^7$ | $d^0d^1d^2d^3$ $d^4d^5d^6d^7$ $e^0e^1e^2e^3$ $e^4e^5e^6e^7$ | $d^0d^1d^2d^3$ $d^4d^5d^6d^7$ $e^0e^1e^2e^3$ $e^4e^5e^6e^7$ | $d^0d^1d^2d^3$ $d^4d^5d^6d^7$ $e^0e^1e^2e^3$ $e^4e^5e^6e^7$ | $c^0c^1c^2c^3$ $c^0c^1c^2c^3$ $c^0c^1c^2c^3$ $c^0c^1c^2c^3$ | | $c^{28}c^{29}c^{30}c^{31}$ $c^{28}c^{29}c^{30}c^{31}$ $c^{28}c^{29}c^{30}c^{31}$ $c^{28}c^{29}c^{30}c^{31}$ |
| 511 | $d^0d^1d^2d^3$ $d^4d^5d^6d^7$ $e^0e^1e^2e^3$ $e^4e^5e^6e^7$ | $d^0d^1d^2d^3$ $d^4d^5d^6d^7$ $e^0e^1e^2e^3$ $e^4e^5e^6e^7$ | $d^0d^1d^2d^3$ $d^4d^5d^6d^7$ $e^0e^1e^2e^3$ $e^4e^5e^6e^7$ | $d^0d^1d^2d^3$ $d^4d^5d^6d^7$ $e^0e^1e^2e^3$ $e^4e^5e^6e^7$ | | $d^0d^1d^2d^3$ $d^4d^5d^6d^7$ $e^0e^1e^2e^3$ $e^4e^5e^6e^7$ | $d^0d^1d^2d^3$ $d^4d^5d^6d^7$ $e^0e^1e^2e^3$ $e^4e^5e^6e^7$ | $d^0d^1d^2d^3$ $d^4d^5d^6d^7$ $e^0e^1e^2e^3$ $e^4e^5e^6e^7$ | $d^0d^1d^2d^3$ $d^4d^5d^6d^7$ $e^0e^1e^2e^3$ $e^4e^5e^6e^7$ | $c^0c^1c^2c^3$ $c^0c^1c^2c^3$ $c^0c^1c^2c^3$ $c^0c^1c^2c^3$ | | $c^{28}c^{29}c^{30}c^{31}$ $c^{28}c^{29}c^{30}c^{31}$ $c^{28}c^{29}c^{30}c^{31}$ $c^{28}c^{29}c^{30}c^{31}$ |
| CRC 0 | $c^0c^0c^0c^0$ $c^1c^1c^1c^1$ $c^2c^2c^2c^2$ $c^3c^3c^3c^3$ | $c^0c^0c^0c^0$ $c^1c^1c^1c^1$ $c^2c^2c^2c^2$ $c^3c^3c^3c^3$ | $c^0c^0c^0c^0$ $c^1c^1c^1c^1$ $c^2c^2c^2c^2$ $c^3c^3c^3c^3$ | $c^0c^0c^0c^0$ $c^1c^1c^1c^1$ $c^2c^2c^2c^2$ $c^3c^3c^3c^3$ | | $c^0c^0c^0c^0$ $c^1c^1c^1c^1$ $c^2c^2c^2c^2$ $c^3c^3c^3c^3$ | $c^0c^0c^0c^0$ $c^1c^1c^1c^1$ $c^2c^2c^2c^2$ $c^3c^3c^3c^3$ | $c^0c^0c^0c^0$ $c^1c^1c^1c^1$ $c^2c^2c^2c^2$ $c^3c^3c^3c^3$ | $c^0c^0c^0c^0$ $c^1c^1c^1c^1$ $c^2c^2c^2c^2$ $c^3c^3c^3c^3$ | | | |
| ⋮ | | | | | | | | | | | | |
| CRC 7 | $c^0c^0c^0c^0$ $c^1c^1c^1c^1$ $c^2c^2c^2c^2$ $c^3c^3c^3c^3$ | $c^0c^0c^0c^0$ $c^1c^1c^1c^1$ $c^2c^2c^2c^2$ $c^3c^3c^3c^3$ | $c^0c^0c^0c^0$ $c^1c^1c^1c^1$ $c^2c^2c^2c^2$ $c^3c^3c^3c^3$ | $c^0c^0c^0c^0$ $c^1c^1c^1c^1$ $c^2c^2c^2c^2$ $c^3c^3c^3c^3$ | | $c^0c^0c^0c^0$ $c^1c^1c^1c^1$ $c^2c^2c^2c^2$ $c^3c^3c^3c^3$ | $c^0c^0c^0c^0$ $c^1c^1c^1c^1$ $c^2c^2c^2c^2$ $c^3c^3c^3c^3$ | $c^0c^0c^0c^0$ $c^1c^1c^1c^1$ $c^2c^2c^2c^2$ $c^3c^3c^3c^3$ | $c^0c^0c^0c^0$ $c^1c^1c^1c^1$ $c^2c^2c^2c^2$ $c^3c^3c^3c^3$ | | | |

Array Size = 512 codewords by 512 codewords = 262,144 Bytes
ECC Size = 262,144 Bytes
CRC Size = 512 by 2 edges by 8 CWs by 2 bytes/CW = 16,384 Bytes
Efficiency = 262,144 / [(262,144 x 2) + 16,384] = 0.4848

Figure 18

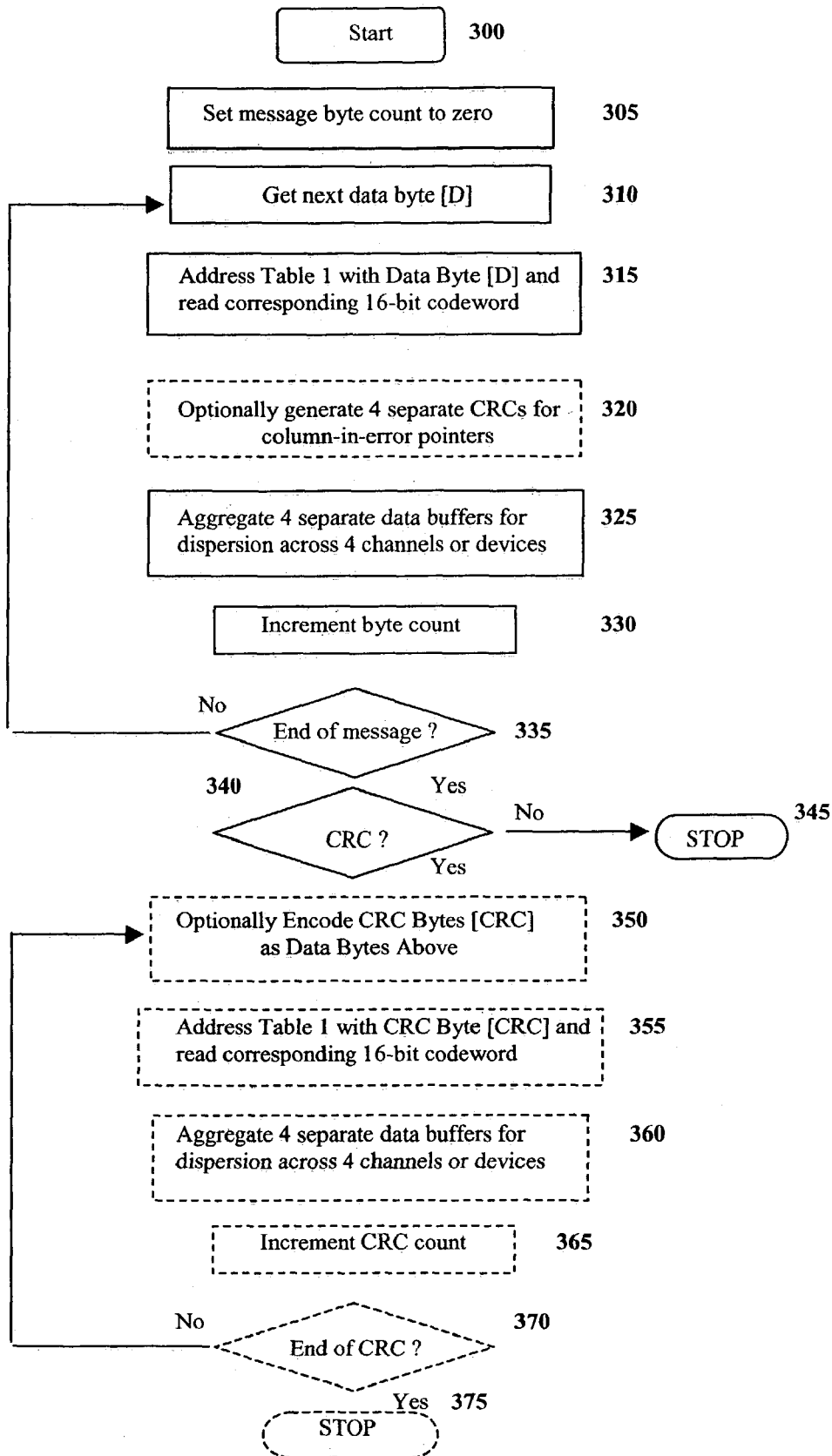
Figure 19 Flowchart for encoding codeword arrays

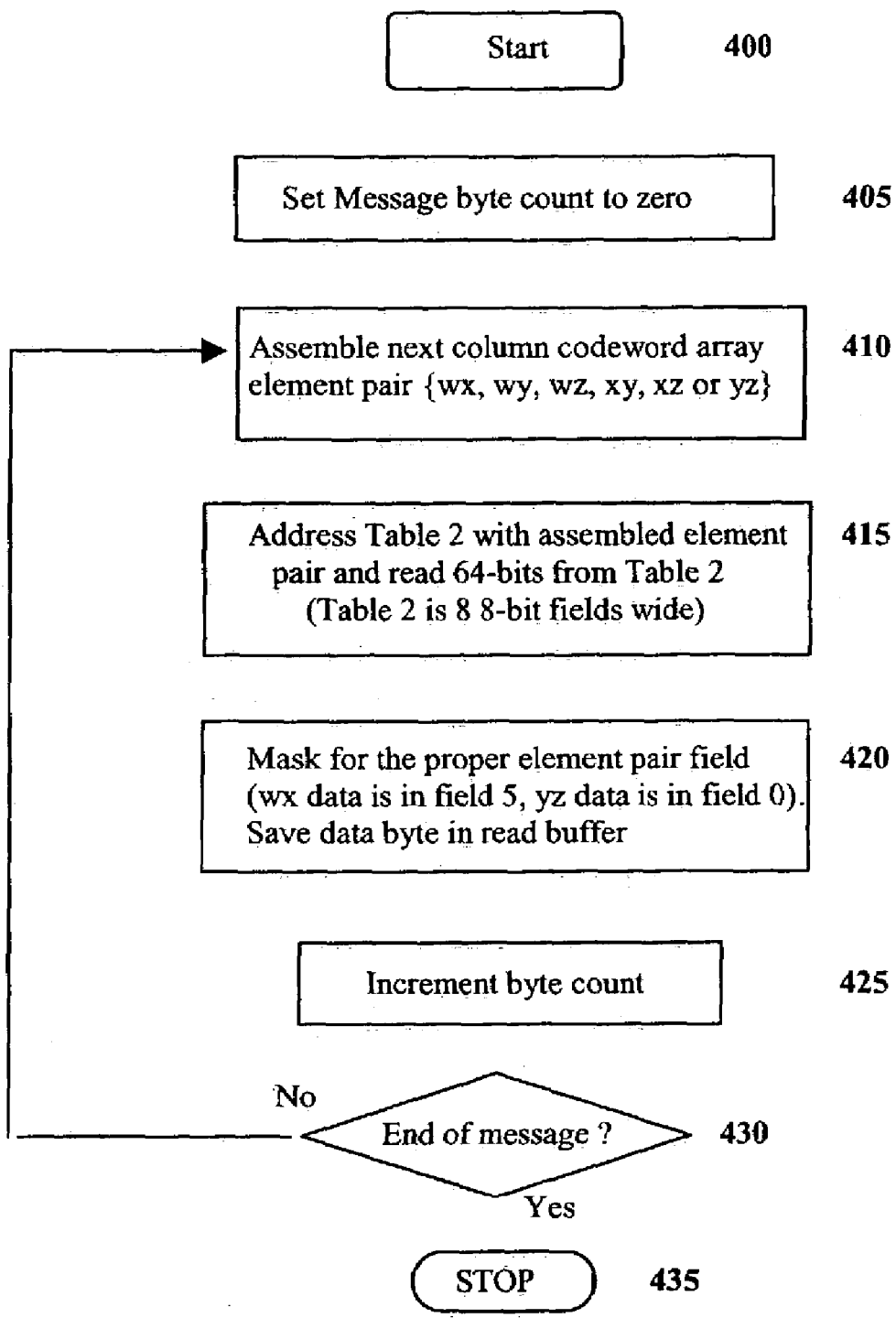
Figure 20 Flowchart for decoding codewords

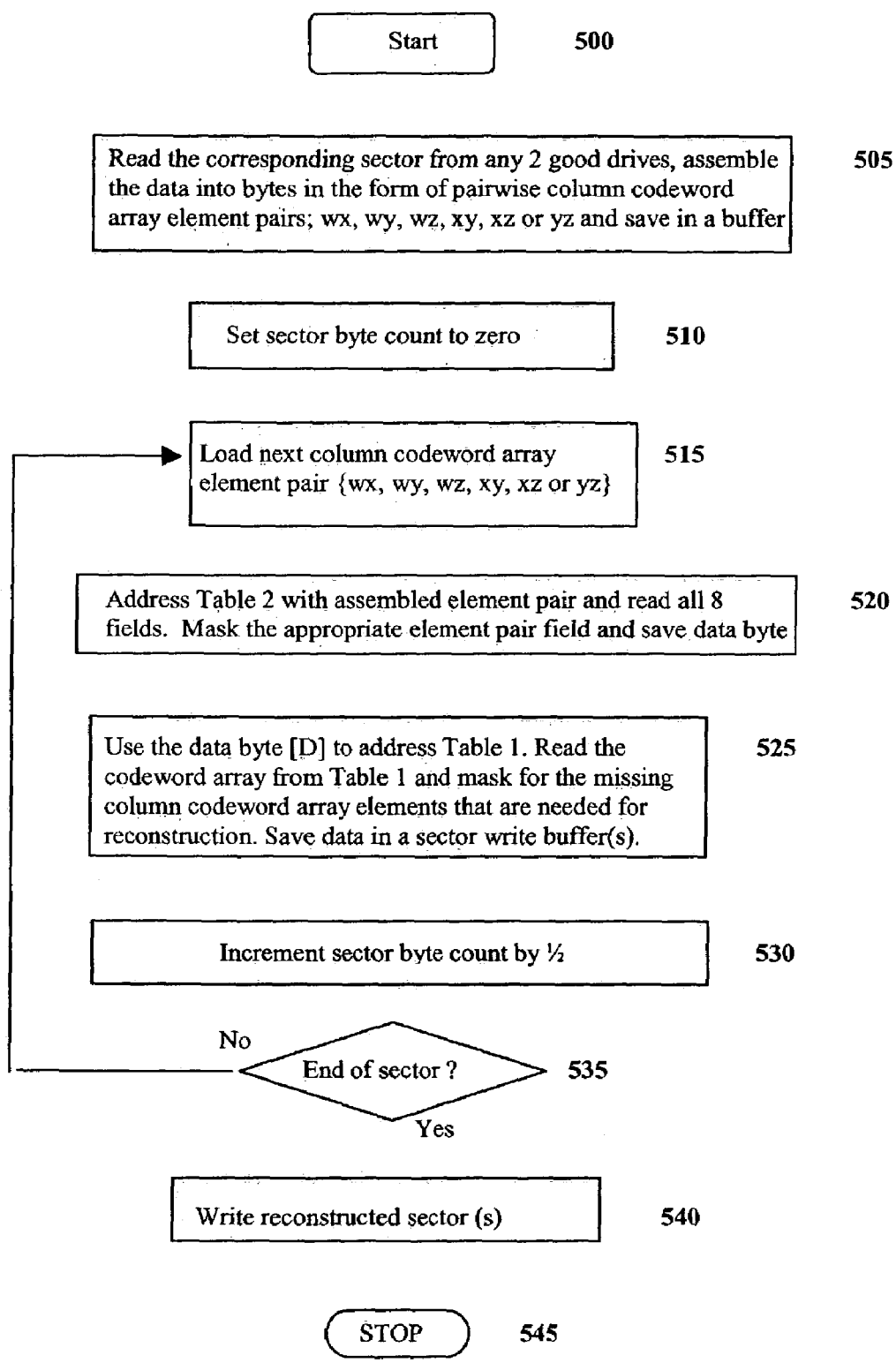
Figure 21 Flowchart for reconstructing a disk drive sector

Table 1 Codewords denoted as column elements
The table codewords is based on column values using the ECC polynomial
$g1(x) = 1 + x3 + x4 + x5 + x8$. A similar table shows the codewords based on row values.

The codeword [CWi]= [Di] [Ei] = d0d1d2d3d4d5d6d7e0e1e2e3e4e5e6e7
The codeword in binary array form:

```
[Di]    d0d1d2d3   s    {hexadecimal row dispersal}
        d4d5d6d7   t
[Ei]    e0e1e2e3   u
        e4e5e6e7   v
        ---------
         w x y z        {hexadecimal column dispersal}
```

Codeword packet generation {all values are hexadecimal}

| Data | cp | Data | cp | Data | cp | Data | cp | Data | cp | Data | cp | Data | cp | Data | cp |
|------|------|------|------|------|------|------|------|------|------|------|------|------|------|------|------|
| 00 | 0000 | 01 | D804 | 02 | 8D80 | 03 | 5584 | 04 | 08D8 | 05 | D0DC | 06 | 8558 | 07 | 5D5C |
| 08 | C889 | 09 | 108D | 0A | 4509 | 0B | 9D0D | 0C | C051 | 0D | 1855 | 0E | 4DD1 | 0F | 95D5 |
| 10 | E48C | 11 | 3C88 | 12 | 690C | 13 | B108 | 14 | EC54 | 15 | 3450 | 16 | 61D4 | 17 | B9D0 |
| 18 | 2C05 | 19 | F401 | 1A | A185 | 1B | 7981 | 1C | 24DD | 1D | FCD9 | 1E | A95D | 1F | 7159 |
| 20 | 464C | 21 | 9E48 | 22 | CBCC | 23 | 13C8 | 24 | 4E94 | 25 | 9690 | 26 | C314 | 27 | 1B10 |
| 28 | 8EC5 | 29 | 56C1 | 2A | 0345 | 2B | DB41 | 2C | 861D | 2D | 5E19 | 2E | 0B9D | 2F | D399 |
| 30 | A2C0 | 31 | 7AC4 | 32 | 2F40 | 33 | F744 | 34 | AA18 | 35 | 721C | 36 | 2798 | 37 | FF9C |
| 38 | 6A49 | 39 | B24D | 3A | E7C9 | 3B | 3FCD | 3C | 6291 | 3D | BA95 | 3E | EF11 | 3F | 3715 |
| 40 | 4C60 | 41 | 9464 | 42 | C1E0 | 43 | 19E4 | 44 | 44B8 | 45 | 9CBC | 46 | C938 | 47 | 113C |
| 48 | 84E9 | 49 | 5CED | 4A | 0969 | 4B | D16D | 4C | 8C31 | 4D | 5435 | 4E | 01B1 | 4F | D9B5 |
| 50 | A8EC | 51 | 70E8 | 52 | 256C | 53 | FD68 | 54 | A034 | 55 | 7830 | 56 | 2DB4 | 57 | F5B0 |
| 58 | 6065 | 59 | B861 | 5A | EDE5 | 5B | 35E1 | 5C | 68BD | 5D | B0B9 | 5E | E53D | 5F | 3D39 |
| 60 | 0A2C | 61 | D228 | 62 | 87AC | 63 | 5FA8 | 64 | 02F4 | 65 | DAF0 | 66 | 8F74 | 67 | 5770 |
| 68 | C2A5 | 69 | 1AA1 | 6A | 4F25 | 6B | 9721 | 6C | CA7D | 6D | 1279 | 6E | 47FD | 6F | 9FF9 |
| 70 | EEA0 | 71 | 36A4 | 72 | 6320 | 73 | BB24 | 74 | E678 | 75 | 3E7C | 76 | 6BF8 | 77 | B3FC |
| 78 | 2629 | 79 | FE2D | 7A | ABA9 | 7B | 73AD | 7C | 2EF1 | 7D | F6F5 | 7E | A371 | 7F | 7B75 |
| 80 | 04C6 | 81 | DCC2 | 82 | 8946 | 83 | 5142 | 84 | 0C1E | 85 | D41A | 86 | 819E | 87 | 599A |
| 88 | CC4F | 89 | 144B | 8A | 41CF | 8B | 99CB | 8C | C497 | 8D | 1C93 | 8E | 4917 | 8F | 9113 |
| 90 | E04A | 91 | 384E | 92 | 6DCA | 93 | B5CE | 94 | E892 | 95 | 3096 | 96 | 6512 | 97 | BD16 |
| 98 | 28C3 | 99 | F0C7 | 9A | A543 | 9B | 7D47 | 9C | 201B | 9D | F81F | 9E | AD9B | 9F | 759F |
| A0 | 428A | A1 | 9A8E | A2 | CF0A | A3 | 170E | A4 | 4A52 | A5 | 9256 | A6 | C7D2 | A7 | 1FD6 |
| A8 | 8A03 | A9 | 5207 | AA | 0783 | AB | DF87 | AC | 82DB | AD | 5ADF | AE | 0F5B | AF | D75F |
| B0 | A606 | B1 | 7E02 | B2 | 2B86 | B3 | F382 | B4 | AEDE | B5 | 76DA | B6 | 235E | B7 | FB5A |
| B8 | 6E8F | B9 | B68B | BA | E30F | BB | 3B0B | BC | 6657 | BD | BE53 | BE | EBD7 | BF | 33D3 |
| C0 | 48A6 | C1 | 90A2 | C2 | C526 | C3 | 1D22 | C4 | 407E | C5 | 987A | C6 | CDFE | C7 | 15FA |
| C8 | 802F | C9 | 582B | CA | 0DAF | CB | D5AB | CC | 88F7 | CD | 50F3 | CE | 0577 | CF | DD73 |
| D0 | AC2A | D1 | 742E | D2 | 21AA | D3 | F9AE | D4 | A4F2 | D5 | 7CF6 | D6 | 2972 | D7 | F176 |
| D8 | 64A3 | D9 | BCA7 | DA | E923 | DB | 3127 | DC | 6C7B | DD | B47F | DE | E1FB | DF | 39FF |
| E0 | 0EEA | E1 | D6EE | E2 | 836A | E3 | 5B6E | E4 | 0632 | E5 | DE36 | E6 | 8BB2 | E7 | 53B6 |
| E8 | C663 | E9 | 1E67 | EA | 4BE3 | EB | 93E7 | EC | CEBB | ED | 16BF | EE | 433B | EF | 9B3F |
| F0 | EA66 | F1 | 3262 | F2 | 67E6 | F3 | BFE2 | F4 | E2BE | F5 | 3ABA | F6 | 6F3E | F7 | B73A |
| F8 | 22EF | F9 | FAEB | FA | AF6F | FB | 776B | FC | 2A37 | FD | F233 | FE | A7B7 | FF | 7FB3 |

Table 2 - Column Decode Table (abbreviated)
  Decoding table for columns. {all values are hexadecimal}
  Data In outputs ECC in Frame 7
  ECC in outputs Data in Frame 6
  Couplet wx, wy, wz, xy, xz and yz in outputs Data in Frames 0 - 5

| Byte number | 7 | 6 | 5 | 4 | 3 | 2 | 1 | 0 |
|---|---|---|---|---|---|---|---|---|
| Addr. = {dat ecc, cpq pair} | ECC {addr = data} | DATA {addr = ecc} | DATA {addr = wx} | DATA {addr = wy} | DATA {addr = wz} | DATA {addr = xy} | DATA {addr = xz} | DATA {addr = yz} |
| 00 | 00 | 00 | 00 | 00 | 00 | 00 | 00 | 00 |
| 01 | 39 | 72 | 4E | 84 | 4E | C8 | 0C | 19 |
| 02 | 72 | E4 | 64 | 60 | E4 | 9C | C1 | B1 |
| 03 | 4B | 96 | 2A | E4 | AA | 54 | CD | A8 |
| 04 | E4 | F1 | 80 | 2A | 64 | 90 | 54 | 01 |
| 05 | DD | 83 | CE | AE | 2A | 0C | 58 | 18 |
| 06 | 96 | 15 | E4 | 4A | 80 | 58 | 95 | B0 |
| 07 | AF | 67 | AA | CE | CE | C4 | 99 | A9 |
| 08 | F1 | DB | 04 | AA | 04 | 09 | 51 | 13 |
| 09 | C8 | A9 | 4A | 2E | 4A | 95 | 5D | 0A |
| 0A | 83 | 3F | 60 | CA | E0 | C1 | 90 | A2 |
| 0B | BA | 4D | 2E | 4E | AE | 5D | 96 | BB |
| 0C | 15 | 2A | 84 | 80 | 60 | 99 | 05 | 12 |
| 0D | 2C | 58 | CA | 04 | 2E | 05 | 09 | 0B |
| 0E | 67 | CE | E0 | E0 | 84 | 57 | C4 | A3 |
| 0F | 5E | BC | AE | 64 | CA | CD | C8 | C8 |
| 10 | DB | 8F | 09 | A3 | 27 | 13 | 42 | 27 |
| 11 | E2 | FD | 47 | 27 | 69 | 8F | 4E | 3E |
| 12 | A9 | 6B | 6D | C3 | C3 | DB | 83 | 96 |
| 1F | 85 | 33 | A7 | C7 | ED | DE | 8A | 9D |
| 43 | 6C | D8 | EE | EE | EA | 40 | D8 | 9A |
| 47 | 88 | 29 | 6E | C4 | 8E | D0 | 8C | 9B |
| 9C | 80 | 39 | 45 | 8B | 45 | 8B | 12 | 37 |
| D2 | C0 | B9 | 61 | 61 | 81 | C3 | C3 | A6 |
| E5 | 3B | 76 | 5E | 14 | 5A | BD | 28 | 5A |
| E6 | 70 | E0 | 74 | F0 | F0 | E9 | E5 | F2 |
| E7 | 49 | 92 | 3A | 74 | BE | 75 | E9 | EB |
| E8 | 17 | 2E | 94 | 10 | 74 | B8 | 21 | 51 |
| E9 | 2E | 5C | DA | 94 | 3A | 24 | 2D | 48 |
| EA | 65 | CA | F0 | 70 | 90 | 70 | E0 | E0 |
| EB | 5C | B8 | BE | F4 | DE | EC | EC | F9 |
| EC | F3 | DF | 14 | 3A | 10 | 28 | 75 | 50 |
| ED | CA | AD | 5A | BE | 5E | B4 | 79 | 49 |
| EE | 81 | 3B | 70 | 5A | F4 | E0 | B4 | E1 |
| EF | B8 | 49 | 3E | DE | BA | 7C | B8 | F8 |
| F0 | 3D | 7A | 99 | 19 | 57 | A2 | 32 | 65 |
| F1 | 04 | 08 | D7 | 9D | 19 | F1 | F1 | 7C |
| F2 | 4F | 9E | FD | 79 | B3 | 6A | F3 | D4 |
| F3 | 76 | EC | B3 | FD | FD | F6 | FF | CD |
| F4 | D9 | 8B | 19 | 33 | 33 | 32 | 66 | 64 |
| F5 | E0 | F9 | 57 | B7 | 7D | AE | 6A | 7D |
| F6 | AB | 6F | 7D | 53 | D7 | FA | A7 | D5 |
| F7 | 92 | 1D | 33 | D7 | 99 | 66 | AB | CC |
| F8 | CC | A1 | 9D | B3 | 53 | AB | 63 | 76 |
| F9 | F5 | D3 | D3 | 37 | 1D | 37 | 6F | 6F |
| FA | BE | 45 | F9 | D3 | B7 | 63 | A2 | C7 |
| FB | 87 | 37 | B7 | 57 | F9 | FF | AE | DE |
| FC | 28 | 50 | 1D | 99 | 37 | 3B | 37 | 77 |
| FD | 11 | 22 | 53 | 1D | 79 | A7 | 3B | 6E |
| FE | 5A | B4 | 79 | F9 | D3 | F3 | F6 | C6 |
| FF | 63 | C6 | 37 | 7D | 9D | 6F | FA | DF |

Table 3 Codewords denoted as row elements
The table codewords is based on row values using the ECC polynomial
$g_1(x) = 1 + x^3 + x^4 + x^5 + x^8$. A similar table shows the codewords based on column values.

The codeword $[CW_i] = [D_i] [E_i] = d^0d^1d^2d^3d^4d^5d^6d^7e^0e^1e^2e^3e^4e^5e^6e^7$
The codeword in binary array form:

```
[D_i]    d⁰d¹d²d³  s    {hexadecimal row dispersal}
         d⁴d⁵d⁶d⁷  t
[E_i]    e⁰e¹e²e³  u
         e⁴e⁵e⁶e⁷  v
         --------
         w x y z   {hexadecimal column dispersal}
```

Codeword packet generation {all values are hexadecimal}

| Data | cp | Data | cp | Data | cp | Data | cp | Data | cp | Data | cp | Data | cp | Data | cp |
|---|---|---|---|---|---|---|---|---|---|---|---|---|---|---|---|
| 00 | 0000 | 01 | 1093 | 02 | 2027 | 03 | 30B4 | 04 | 404E | 05 | 50DD | 06 | 6069 | 07 | 70FA |
| 08 | 801F | 09 | 908C | 0A | A038 | 0B | B0AB | 0C | C051 | 0D | D0C2 | 0E | E076 | 0F | F0E5 |
| 10 | 01BD | 11 | 112E | 12 | 219A | 13 | 3109 | 14 | 41F3 | 15 | 5160 | 16 | 61D4 | 17 | 7147 |
| 18 | 81A2 | 19 | 9131 | 1A | A185 | 1B | B116 | 1C | C1EC | 1D | D17F | 1E | E1CB | 1F | F158 |
| 20 | 02F8 | 21 | 126B | 22 | 22DF | 23 | 324C | 24 | 42B6 | 25 | 5225 | 26 | 6291 | 27 | 7202 |
| 28 | 82E7 | 29 | 9274 | 2A | A2C0 | 2B | B253 | 2C | C2A9 | 2D | D23A | 2E | E28E | 2F | F21D |
| 30 | 0345 | 31 | 13D6 | 32 | 2362 | 33 | 33F1 | 34 | 430B | 35 | 5398 | 36 | 632C | 37 | 73BF |
| 38 | 835A | 39 | 93C9 | 3A | A37D | 3B | B3EE | 3C | C314 | 3D | D387 | 3E | E333 | 3F | F3A0 |
| 40 | 0472 | 41 | 14E1 | 42 | 2455 | 43 | 34C6 | 44 | 443C | 45 | 54AF | 46 | 641B | 47 | 7488 |
| 48 | 846D | 49 | 94FE | 4A | A44A | 4B | B4D9 | 4C | C423 | 4D | D4B0 | 4E | E404 | 4F | F497 |
| 50 | 05CF | 51 | 155C | 52 | 25E8 | 53 | 357B | 54 | 4581 | 55 | 5512 | 56 | 65A6 | 57 | 7535 |
| 58 | 85D0 | 59 | 9543 | 5A | A5F7 | 5B | B564 | 5C | C59E | 5D | D50D | 5E | E5B9 | 5F | F52A |
| 60 | 068A | 61 | 1619 | 62 | 26AD | 63 | 363E | 64 | 46C4 | 65 | 5657 | 66 | 66E3 | 67 | 7670 |
| 68 | 8695 | 69 | 9606 | 6A | A6B2 | 6B | B621 | 6C | C6DB | 6D | D648 | 6E | E6FC | 6F | F66F |
| 70 | 0737 | 71 | 17A4 | 72 | 2710 | 73 | 3783 | 74 | 4779 | 75 | 57EA | 76 | 675E | 77 | 77CD |
| 78 | 8728 | 79 | 97BB | 7A | A70F | 7B | B79C | 7C | C766 | 7D | D7F5 | 7E | E741 | 7F | F7D2 |
| 80 | 08E4 | 81 | 1877 | 82 | 28C3 | 83 | 3850 | 84 | 48AA | 85 | 5839 | 86 | 688D | 87 | 781E |
| 88 | 88FB | 89 | 9868 | 8A | A8DC | 8B | B84F | 8C | C8B5 | 8D | D826 | 8E | E892 | 8F | F801 |
| 90 | 0959 | 91 | 19CA | 92 | 297E | 93 | 39ED | 94 | 4917 | 95 | 5984 | 96 | 6930 | 97 | 79A3 |
| 98 | 8946 | 99 | 99D5 | 9A | A961 | 9B | B9F2 | 9C | C908 | 9D | D99B | 9E | E92F | 9F | F9BC |
| A0 | 0A1C | A1 | 1A8F | A2 | 2A3B | A3 | 3AA8 | A4 | 4A52 | A5 | 5AC1 | A6 | 6A75 | A7 | 7AE6 |
| A8 | 8A03 | A9 | 9A90 | AA | AA24 | AB | BAB7 | AC | CA4D | AD | DADE | AE | EA6A | AF | FAF9 |
| B0 | 0BA1 | B1 | 1B32 | B2 | 2B86 | B3 | 3B15 | B4 | 4BEF | B5 | 5B7C | B6 | 6BC8 | B7 | 7B5B |
| B8 | 8BBE | B9 | 9B2D | BA | AB99 | BB | BB0A | BC | CBF0 | BD | DB63 | BE | EBD7 | BF | FB44 |
| C0 | 0C96 | C1 | 1C05 | C2 | 2CB1 | C3 | 3C22 | C4 | 4CD8 | C5 | 5C4B | C6 | 6CFF | C7 | 7C6C |
| C8 | 8C89 | C9 | 9C1A | CA | ACAE | CB | BC3D | CC | CCC7 | CD | DC54 | CE | ECE0 | CF | FC73 |
| D0 | 0D2B | D1 | 1DB8 | D2 | 2D0C | D3 | 3D9F | D4 | 4D65 | D5 | 5DF6 | D6 | 6D42 | D7 | 7DD1 |
| D8 | 8D34 | D9 | 9DA7 | DA | AD13 | DB | BD80 | DC | CD7A | DD | DDE9 | DE | ED5D | DF | FDCE |
| E0 | 0E6E | E1 | 1EFD | E2 | 2E49 | E3 | 3EDA | E4 | 4E20 | E5 | 5EB3 | E6 | 6E07 | E7 | 7E94 |
| E8 | 8E71 | E9 | 9EE2 | EA | AE56 | EB | BEC5 | EC | CE3F | ED | DEAC | EE | EE18 | EF | FE8B |
| F0 | 0FD3 | F1 | 1F40 | F2 | 2FF4 | F3 | 3F67 | F4 | 4F9D | F5 | 5F0E | F6 | 6FBA | F7 | 7F29 |
| F8 | 8FCC | F9 | 9F5F | FA | AFEB | FB | BF78 | FC | CF82 | FD | DF11 | FE | EFA5 | FF | FF36 |

Table 4 - Row Decode Table (abbreviated)
  Decoding table for rows. {all values are hexadecimal}
  Data In outputs ECC in Frame 7
  ECC in outputs Data in Frame 6
  Couplet st, su, sv, tu, tv or uv in outputs Data in Frames 0 - 5

| Byte number | 7 | 6 | 5 | 4 | 3 | 2 | 1 | 0 |
|---|---|---|---|---|---|---|---|---|
| Addr. = {data, ecc, cpq pair} | ECC {addr = data} | DATA {addr = ecc} | DATA {addr = st} | DATA {addr = su} | DATA {addr = sv} | DATA {addr = tu} | DATA {addr = tv} | DATA {addr = uv} |
| 00 | 00 | 00 | 00 | 00 | 00 | 00 | 00 | 00 |
| 01 | 39 | 72 | 10 | A0 | B0 | 08 | 0C | 8F |
| 02 | 72 | E4 | 20 | D0 | 40 | 02 | 0D | 27 |
| 03 | 4B | 96 | 30 | 70 | F0 | 0A | 01 | A8 |
| 04 | E4 | F1 | 40 | 30 | 80 | 04 | 03 | 4E |
| 05 | DD | 83 | 50 | 90 | 30 | 0C | 0F | C1 |
| 06 | 96 | 15 | 60 | E0 | C0 | 06 | 0E | 69 |
| 07 | AF | 67 | 70 | 40 | 70 | 0E | 02 | E6 |
| 08 | F1 | DB | 80 | 60 | 20 | 09 | 0A | 9C |
| 09 | C8 | A9 | 90 | C0 | 90 | 01 | 06 | 13 |
| 0A | 83 | 3F | A0 | B0 | 60 | 0B | 07 | BB |
| 0B | BA | 4D | B0 | 10 | D0 | 03 | 0B | 34 |
| 0C | 15 | 2A | C0 | 50 | A0 | 0D | 09 | D2 |
| 0D | 2C | 58 | D0 | F0 | 10 | 05 | 05 | 5D |
| 0E | 67 | CE | E0 | 80 | E0 | 0F | 04 | F5 |
| 0F | 5E | BC | F0 | 20 | 50 | 07 | 08 | 7A |
| 10 | DB | 8F | 01 | C1 | F1 | 13 | 15 | 72 |
| 11 | E2 | FD | 11 | 61 | 41 | 1B | 19 | FD |
| 12 | A9 | 6B | 21 | 11 | B1 | 11 | 18 | 55 |
| 1F | 85 | 33 | F1 | E1 | A1 | 14 | 1D | 08 |
| 43 | 6C | D8 | 34 | 44 | 14 | 44 | 4C | 59 |
| 47 | 88 | 29 | 74 | 74 | 94 | 40 | 47 | E2 |
| 9C | 80 | 39 | C9 | 39 | 09 | 91 | 9F | 7B |
| D2 | C0 | B9 | 2D | 8D | 0D | D0 | D6 | 7F |
| E5 | 3B | 76 | 5E | DE | FE | EA | EB | 0F |
| E6 | 70 | E0 | 6E | AE | 0E | E0 | EA | A7 |
| E7 | 49 | 92 | 7E | 0E | BE | E8 | E6 | 28 |
| E8 | 17 | 2E | 8E | 2E | EE | EF | EE | 52 |
| E9 | 2E | 5C | 9E | 8E | 5E | E7 | E2 | DD |
| EA | 65 | CA | AE | FE | AE | ED | E3 | 75 |
| EB | 5C | B8 | BE | 5E | 1E | E5 | EF | FA |
| EC | F3 | DF | CE | 1E | 6E | EB | ED | 1C |
| ED | CA | AD | DE | BE | DE | E3 | E1 | 93 |
| EE | 81 | 3B | EE | CE | 2E | E9 | E0 | 3B |
| EF | B8 | 49 | FE | 6E | 9E | E1 | EC | B4 |
| F0 | 3D | 7A | 0F | 8F | 3F | F5 | F1 | BC |
| F1 | 04 | 08 | 1F | 2F | 8F | FD | FD | 33 |
| F2 | 4F | 9E | 2F | 5F | 7F | F7 | FC | 9B |
| F3 | 76 | EC | 3F | FF | CF | FF | F0 | 14 |
| F4 | D9 | 8B | 4F | BF | BF | F1 | F2 | F2 |
| F5 | E0 | F9 | 5F | 1F | 0F | F9 | FE | 7D |
| F6 | AB | 6F | 6F | 6F | FF | F3 | FF | D5 |
| F7 | 92 | 1D | 7F | CF | 4F | FB | F3 | 5A |
| F8 | CC | A1 | 8F | EF | 1F | FC | FB | 20 |
| F9 | F5 | D3 | 9F | 4F | AF | F4 | F7 | AF |
| FA | BE | 45 | AF | 3F | 5F | FE | F6 | 07 |
| FB | 87 | 37 | BF | 9F | EF | F6 | FA | 88 |
| FC | 28 | 50 | CF | DF | 9F | F8 | F8 | 6E |
| FD | 11 | 22 | DF | 7F | 2F | F0 | F4 | E1 |
| FE | 5A | B4 | EF | 0F | DF | FA | F5 | 49 |
| FF | 63 | C6 | FF | AF | 6F | F2 | F9 | C6 |

Table 5 Error Pattern Table 1 or 2 bit error patterns for polynomial $g_1(x) = 1 + x^3 + x^4 + x^5 + x^8$ addressed by error syndrome values {syndrome values are hexadecimal}. There are 16 single bit errors and 120 double bit errors. For actual use the table values would have error pattern bits set to ones that would toggle the data and ecc bits via the ex-or logical operation. It is also possible to simply translate the results via hardware logical operations.

The codeword $[CW_i] = [D_i] [E_i] = d^0 d^1 d^2 d^3 d^4 d^5 d^6 d^7 e^0 e^1 e^2 e^3 e^4 e^5 e^6 c^7$ D0D1D2D3D4D5D6D7E0E1E2E3E4E5E6E7   D0-D7 is data and E0-E7 is ECC

| Syn | bits | Syn | bits | Syn | bits | Syn | bits | Syn | bits | Syn | bits | Syn | bits | Syn | bits |
|---|---|---|---|---|---|---|---|---|---|---|---|---|---|---|---|
| 00 | ---- | 01 | E0 | 02 | E1 | 03 | E0E1 | 04 | E2 | 05 | E0E2 | 06 | E1E2 | 07 | D6E5 |
| 08 | E3 | 09 | E0E3 | 0A | E1E3 | 0B | ---- | 0C | E2E3 | 0D | ---- | 0E | D7E6 | 0F | D5E7 |
| 10 | E4 | 11 | E0E4 | 12 | E1E4 | 13 | ---- | 14 | E2E4 | 15 | D2D3 | 16 | ---- | 17 | ---- |
| 18 | E3E4 | 19 | D0E5 | 1A | ---- | 1B | ---- | 1C | ---- | 1D | ---- | 1E | D0D6 | 1F | ---- |
| 20 | E5 | 21 | E0E5 | 22 | E1E5 | 23 | D6E2 | 24 | E2E5 | 25 | D6E1 | 26 | D6E0 | 27 | D6 |
| 28 | E3E5 | 29 | D0E4 | 2A | D3D4 | 2B | ---- | 2C | ---- | 2D | ---- | 2E | ---- | 2F | D6E3 |
| 30 | E4E5 | 31 | D0E3 | 32 | D1E6 | 33 | ---- | 34 | ---- | 35 | ---- | 36 | ---- | 37 | D6E4 |
| 38 | D0E0 | 39 | D0 | 3A | ---- | 3B | D0E1 | 3C | D1D7 | 3D | D0E2 | 3E | ---- | 3F | D2D4 |
| 40 | E6 | 41 | E0E6 | 42 | E1E6 | 43 | ---- | 44 | E2E6 | 45 | ---- | 46 | D7E3 | 47 | ---- |
| 48 | E3E6 | 49 | ---- | 4A | D7E2 | 4B | D0D1 | 4C | D7E1 | 4D | ---- | 4E | D7 | 4F | D7E0 |
| 50 | E4E6 | 51 | ---- | 52 | D1E5 | 53 | ---- | 54 | D4D5 | 55 | D1D6 | 56 | ---- | 57 | ---- |
| 58 | ---- | 59 | ---- | 5A | ---- | 5B | D4E7 | 5C | ---- | 5D | ---- | 5E | D7E4 | 5F | ---- |
| 60 | E5E6 | 61 | ---- | 62 | D1E4 | 63 | ---- | 64 | D2E7 | 65 | ---- | 66 | ---- | 67 | D6E6 |
| 68 | ---- | 69 | D6D7 | 6A | ---- | 6B | D2D5 | 6C | ---- | 6D | ---- | 6E | D7E5 | 6F | ---- |
| 70 | D1E1 | 71 | D3E7 | 72 | D1 | 73 | D1E0 | 74 | ---- | 75 | ---- | 76 | D1E2 | 77 | D0D7 |
| 78 | ---- | 79 | D0E6 | 7A | D1E3 | 7B | ---- | 7C | ---- | 7D | ---- | 7E | D3D5 | 7F | ---- |
| 80 | E7 | 81 | E0E7 | 82 | E1E7 | 83 | D1D3 | 84 | E2E7 | 85 | ---- | 86 | ---- | 87 | D5E3 |
| 88 | E3E7 | 89 | ---- | 8A | ---- | 8B | D5E2 | 8C | ---- | 8D | D5E1 | 8E | D5E0 | 8F | D5 |
| 90 | E4E7 | 91 | ---- | 92 | ---- | 93 | ---- | 94 | ---- | 95 | D4D7 | 96 | D1D2 | 97 | ---- |
| 98 | ---- | 99 | ---- | 9A | ---- | 9B | D4E6 | 9C | ---- | 9D | ---- | 9E | ---- | 9F | D5E4 |
| A0 | E5E7 | A1 | ---- | A2 | ---- | A3 | ---- | A4 | D2E6 | A5 | ---- | A6 | ---- | A7 | D6E7 |
| A8 | D5D6 | A9 | D1D4 | AA | D2D7 | AB | ---- | AC | ---- | AD | ---- | AE | ---- | AF | D5E5 |
| B0 | ---- | B1 | D3E6 | B2 | ---- | B3 | ---- | B4 | ---- | B5 | ---- | B6 | D0D5 | B7 | ---- |
| B8 | ---- | B9 | D0E7 | BA | ---- | BB | ---- | BC | ---- | BD | ---- | BE | ---- | BF | D3D7 |
| C0 | E6E7 | C1 | D5D7 | C2 | ---- | C3 | D2D6 | C4 | D2E5 | C5 | ---- | C6 | ---- | C7 | ---- |
| C8 | D0D3 | C9 | ---- | CA | ---- | CB | D4E4 | CC | ---- | CD | ---- | CE | D7E7 | CF | D5E6 |
| D0 | ---- | D1 | D3D5 | D2 | ---- | D3 | D4E3 | D4 | ---- | D5 | ---- | D6 | D3D6 | D7 | ---- |
| D8 | ---- | D9 | D4E1 | DA | D4E0 | DB | D4 | DC | ---- | DD | D0D2 | DE | ---- | DF | D4E2 |
| E0 | D2E2 | E1 | D3E4 | E2 | D0D4 | E3 | ---- | E4 | D2 | E5 | D2E0 | E6 | D2E1 | E7 | ---- |
| E8 | ---- | E9 | ---- | EA | ---- | EB | ---- | EC | D2E3 | ED | ---- | EE | ---- | EF | ---- |
| F0 | D3E0 | F1 | D3 | F2 | D1E7 | F3 | D3E1 | F4 | D2E4 | F5 | D3E2 | F6 | ---- | F7 | ---- |
| F8 | ---- | F9 | D3E3 | FA | ---- | FB | D4E5 | FC | D4D6 | FD | D1D5 | FE | ---- | FF | ---- |

MULTI-DIMENSIONAL DATA PROTECTION AND MIRRORING METHOD FOR MICRO LEVEL DATA

The invention has application in the fields of corporate business continuity and disaster recovery, ultra-resilient storage arrays for space, medical, financial, home and other mission critical applications and resilient distributed messaging within data system networks, routers, switches, directors, adapters, appliances, mobile devices and communication channels.

BACKGROUND OF THE INVENTION

The present application claims the benefit of U.S. Provisional Patent Application Nos. 60/399,635 entitled "Data Dispersion and Mirroring Method with Fast Dual Erasure Correction and Multi-Dimensional Capabilities" filed on Jul. 29, 2002 and 60/460,545 entitled "Composite Data Protection Method for Micro Level Data" filed Apr. 4, 2003.

To information theorists the field of Error Control Codes and Coding was developed to utilize redundancy to maximize transmission rates. To the engineer it is useful to use redundancy to improve data resiliency, guarantee data integrity and to construct fail-safe hardware designs. Some codes are useful only for the detection of errors. Error correction codes are designed to recognize when data is in error, then locate the errors and finally remove the errors and if possible leave some degree of assurance that the final result is accurate. A third major category is that of erasure recovery codes. This is the case where segments of data are dispersed with the expectation that not all segments will be retrievable. Error control codes have been developed for all three major categories; error detection, error correction and erasure recovery. Sometimes a code can be used for double or triple duty. A common practice is to not use all of the mathematical robustness for correction but leave some for post correction data integrity verification. In other instances it is necessary to nest two or more different codes in order to accomplish multiple requirements to an acceptable degree.

Different forms of error control coding have been developed to handle the error modes inherent to ever changing communications channels, memory systems, storage networks and devices and system networks. Within hardware systems error modes are caused by transient effects such as alpha particles, others by asperities in storage media, by electrical noise and signal skew, by physical wear or chemical alteration, by inter-symbol interference and many other phenomena. Each may affect data differently and occur at a different rate and distribution pattern. This has spawned a continuous evolution of new codes and decoding techniques.

Specific examples of error detection codes are the Cyclic Redundancy Check codes CRC-16, CRC-320 and CCITT. They are popular codes used to detect errors in relatively short messages. Their capabilities are well understood but limited. A common application of CRC codes is in data communication where data is formatted into small sequential packets with each packet protected by a CRC checkword. As packets are input at the receiving node the CRC is recalculated and compared with the received CRC checkword. A good compare may result in the return of an acknowledge (ACK) signal. A miss compare might result in an Automatic Retry Request (ARQ) negative acknowledge (NACK) signal. After a limited number of retries the algorithm might assume that success is not likely and the transmission is terminated, delayed or rerouted. In specific applications that can tolerate inaccurate data the data can simply be flagged as being in error.

In coding theory the minimum difference in binary bit assignments between any two codewords is referred to as the Hamming distance, d. There is a direct correlation between the minimum Hamming distance of a code and its' ability to distinguish one codeword from another and also a code's potential for detecting and correcting random bits in error.

Consider the CCITT 16-bit polynomial code. The generator polynomial is $g(x)=1+x^5+x^{12}+x^{16}$. It has a Hamming distance d=4 giving it the following capabilities: 1) It can detect all combinations of 3 random bit errors over its length of 65,536 bits, d=t+1; 2) It can detect all odd bit errors; and 3) It can detect all burst errors of up to 16 bits length.

Single and multiple bit correction over short to medium length messages often use Hamming and BCH codes. This would include applications such as computer memories and other devices that exhibit transient single bit error modes.

Special codes have been developed to correct for single and multiple short burst errors over medium data lengths. Fire codes and the Kasami Computer Generated Cyclic codes are common single burst codes. Reed-Solomon codes are a popular multiple burst error correcting code type. Primary applications for burst error codes are disk read errors due to media asperities or scratches and inter-symbol electronic interference.

In 1967 a code was developed by Nordstrom and Robinson as an existence proof of an n=15, k=8, d=5 code since an n=12, k=5, d=5 code had already been discovered. Here n=total code bits and k=information bits. With a Hamming distance of d=5 it would detect up to 4 single bit errors and correct up to 2 single bit errors. The code length of 15 would be cumbersome in the 8-bit world. It was later determined that the N–R code could be extended to an n=16, k=8 code.

In the book *Algebraic Coding Theory*, (Elwyn Belekamp 1968) the author published that the polynomial whose roots are the finite field elements of order p is called the cyclotomic polynomial, denoted by $Q^{(P)}(x)$. He noted that the factors of $Q^{(17)}(x)$ are $g1(x)=1+x^3+x^4+x^5+x^8$ and $g2(x)=1+x+x^2+x^4+x^6+x^7+x^8$ and that each polynomial could correct two random errors in a block of 17 binary digits.

U.S. Pat. No. 3,868,632 (Hong et al.) discloses that the $Q^{(17)}(x)$ code factors can be further exploited as an erasure code for 9 track tapes called Optimal Rectangular Code. Both tape and tape heads exhibit wear due to contact recording and the aggressive abuse of tape by the handling mechanisms. The most common associated error mode is loss of a media track on tape or the temporary or catastrophic loss of a read/write head. The erasure decoder was designed to recover data on the fly for up to two (typically outside edges) simultaneously failing data streams. The code is actually two different codes working in tandem plus a pointer system to identify which two of nine channels have failed or likely to be in error. Data is formatted in 7-byte groups, each a 56-bit rectangular data array with an 8-bit ECC and 8 bits of side-band parity. A similar dual erasure method has been designed for disk arrays.

The paper, *A Case for Redundant Array of Inexpensive Disk (RAID)*, (Patterson et al., University of California—Berkeley, 1987) describes several methods for achieving disk device resiliency. RAID-1 mirroring is the simple process of generating and maintaining a single duplicate copy of a file, device or file system. RAID-2 has roots with Hamming single error correction/double error detection (SECDED) codes used primarily for computer memory systems. Two forms of erasure recovery that have roots with tape data track erasure recovery are RAID-3 and RAID-5, an extension of RAID-3. Also pertinent to this discussion is RAID-6. RAID-6 is a method that tolerates two device failures (erasures) and also has roots with dual erasure tape systems. There are also RAID-6 examples based on multiple level parity calculations across small data arrays.

The commodity nature of disk storage devices keeps driving the costs lower and lower with a tendency toward producing a single commodity product that supports the smallest to the largest applications. The increasing data capacity of storage products and the business and legal responsibilities now make data resiliency and data integrity requirements more essential than ever before. Business continuity back-up recovery performance requirements often dictate disk drives over tape. This is an opportunity to raise the reliability, integrity and resiliency of those and other applications via the use of new error control coding techniques. RAID-6 dual erasure capability is necessary for data protection while the first failure is being repaired.

Considerable work is in progress in the area of error coding for mobile communications. Convolution codes and many computer generated forward error correcting codes have been developed for serial transmission in the presence of errors. Many different kinds of array codes are being constructed and tested. Some of these rely on a composite of multiple error codes and innovative forms of ARQ retry algorithms for satisfying bandwidth and integrity requirements. In comparison they are exceedingly complex and require complex decoding algorithms such as the Viterbi and turbo methods.

A critical component of contemporary processor and storage architectures is the fabric of switches, routers and links used to scale processors, storage devices and network connectivity. These networks carry different data formats but in general move small to medium size packets of processor cache lines or communication and storage data packets. The requirement for resiliency and data integrity is high. To date cost has limited the error control measures to CRC error detection with ARQ retry methods and rerouting when alternate paths exist. There is inadequate end-to-end data integrity validation and hardware resiliency. Here too it is necessary and possible to raise the integrity, reliability and resiliency of data systems via new error control coding techniques.

The prior art includes some solutions based on the dispersal of data with the recovery via dual erasure control coding. In the context of small disk arrays this is commonly referred to as method RAID level 6. The number of disk drives clustered in these arrays typically varies from as few as four to six to as many as nine or seventeen. Other erasure control applications may be called information dispersal and reconstruction, erasure or loss resilient coding or in specific context forward error correction coding, FEC.

U.S. Pat. Nos. 5,128,810 (Halford) and 5,283,791 (Halford), in the name of the present inventor, show dual drive error correction method using a data bit dispersal with erasure control technique. This method requires a parity side-band drive and a significant amount of computation due to the dual dependent ECC codes (odd parity and irreducible polynomial). This approach is relatively cumbersome and slow if implemented in software. Also the code data array is rectangular M * (M-1) which limits data size flexibility.

U.S. Pat. No. 5,485,474 (Rabin), shows a method also significantly computationally intensive that suggests using a vector processor, systolic array or parallel processor for decoding. Therefore the encoding and decoding is both slow or relatively expensive to implement. Original data is not transmitted in clear systematic form. The preferred embodiment works with multiple bytes per codeword which results in file size matching issues, magnifies the size of encode/decode mechanisms and when dealing with application data can be a source of error migration during both the encode and decode processes. It also does not provide simultaneous error detection and correction nor a multi-dimensional data recovery capability.

U.S. Pat. No. 5,271,012 (Blaum et al.) describes an $M*(M-1)$ data array where M is a prime number. Pairs of simple parity bits are recursively encoded over data in respective and recursive diagonal and row order array directions. The example embodiment shows a 5-drive array with data on 3 drives and parity on 2 drives. Data is encoded in 12-bit quanta and dispersed across the 5 drives in 4-bit quanta.

U.S. Pat. No. 5,579,475 (Blaum et al.) is a continuation of the 1993 patent with certain specific improvements such as a less recursive parity calculation algorithm. The array size M is again a prime number. While the operations are not mathematically complex the calculations are numerous.

U.S. Pat. No. 6,088,330 (Bruck et al.) and U.S. Pat. No. 6,128,277(Bruck et al.) describes a data array encoding where the array is $N*N$ square and N preferably a prime number. If data is dispersed via columns, parity is developed in rows causing each dispersal element to contain both data and parity. Two separate independent parity row calculations are made along two slopes within the data array then stacked at the bottom to complete the encoding. The encoding supports specific error correction capabilities along with dual column erasure recovery. The 5×5 array described in the preferred embodiment represents 15 data bits and 10 parity bits. The decoding operations are numerous.

U.S. Pat. No. 6,138,125 (DeMoss) describes yet another dual-parity method that also requires the formatting of data into arrays with parity diagonals. Here the array is also a square $N*N$ where N+1 is a prime number. Parity positions are the major diagonals and data positions are the remaining non-corner diagonal locations. The computation uses simple logical exclusive-or operations but the algorithm described is relatively extensive, as are all others that format data around diagonal parity vectors.

Many contemporary systems are being built by creating a network of processor/memory nodes utilizing single chip processors designed to meet the basic requirements for systems ranging from workstations to high-end supercomputers. Systems fabrics can be created by the interconnection of routers or switches together with a combination of processor nodes, I/O ports and fabric interconnect ports. An important aspect of some of these systems is for nodes, links and routers to have a specific degree of resiliency. Those with a more automatic resiliency capability are referred to as being fail-safe, self-healing or autonomic. This requirement is also emerging into storage network subsystems.

SUMMARY OF THE INVENTION

The invention provides an ultra-reliable mechanism for transmitting and storing byte quanta data on storage, processing, communications and disaster resistant systems. Comparative methods that encode data in quanta either larger or smaller than 8 bits require residual fractional packets in many applications. This invention can deal with as little as a single byte and up to any integer value of multiple bytes in a most flexible manner. This primary object of the invention is to provide both data integrity and data resiliency for each data byte. The data integrity capability includes robust data validation with quantitative error detection at the micro level. The data resiliency capability includes a quantitative error correction capability for multiple random bit errors and a quantitative two, three or four-way dispersal method for single and dual erasure recovery also at the byte level. It is also a primary object of the invention that all aspects of the composite error control method work for serial and parallel data formats including the capability to work for specific two-dimensional data and device configurations. The more capable and flexible the method the more useful and ubiquitous it can become within a large system and within the industry.

Refer to FIG. 1 item 100. A polynomial error control code is chosen to have an equal number of redundant bits (8) as data bits (8) for codewords 16 bits in length. There are 256 possible data bytes, [Di], 00–FF hexadecimal and 256 different ECC bytes [Ei] (00–FF hexadecimal). Therefore after concatenating the data and corresponding ECC bytes there are also 256 separate codewords [CWi]=[Di][Ei] where i is the ith information in the datagram.

The invention relates to error control coding of byte quanta data. The 8-bit byte is the lowest common data size typical in the vast majority of data processing, communication and storage equipment. The invention brings data validation, error detection, error correction, mirroring and erasure recovery into a single composite method at the micro, byte quanta, level. This flexibility provides improved data integrity and resiliency methods that benefit many critical data applications.

The invention has application in the fields of corporate business continuity and disaster recovery, ultra-resilient storage arrays for space, medical, financial, home and other mission critical applications and resilient distributed messaging within data system networks, routers, switches, directors, adapters, appliances, mobile devices and communication channels.

The invention also enables error and erasure correction over two dimensions of aggregated data bytes. While the preferred embodiment describes a single dimensional RAID application the two-dimensional column and row method enables a new method for future applications such as memory device technologies with initial inherent high error rates. Note that this error control code can simultaneously do erasure recovery in two dimensions on data as opposed to some existing error control codes that construct codewords by calculating parity in two dimensions.

Since the invention performs error detection, error correction and erasure recovery at the data byte level there is sufficient flexibility to incorporate these capabilities in an end-to-end fashion across a system fabric including data channels, messaging planes, routers, storage switches and storage devices.

High speed switched parallel connections are common in modern computers of the variety called scalable servers. These machines rely on a very small number of ASIC types per system design. There is typically only one or two ASIC types beyond the processor chip itself. It is possible to have a single large hub ASIC for the interface to the processor, memory, I/O and system interconnect ports. The bandwidth of the system interconnect ports is critical in that remote memory data references must transit this network. At the same time it is advantageous to have as many ports as possible in order to expand the connection fabric in as many dimensions as possible without having to rely on external router ASICs. In the largest of systems it is necessary to have it all; high bandwidth ports, several system interconnect ports at the node level and external router ASICs to further expand the system fabric. In these larger systems the interconnection fabric becomes a significant aspect of the total hardware cost, system reliability and maintenance strategy.

The recently developed HyperTransport channel is one example of a high-speed parallel system channel. HyperTransport is intended to support a wide range of applications including routers, hubs, switches, servers, workstations, PCs, desk tops, mobile game consoles, hand-held devices and embedded systems. The HyperTransport channel can be 2, 4, 8, 16 or 32 bits wide with transfer size in multiples of 4 bytes. It expects three predominant error modes; a data line error, a clock (frame) error and a window (single symbol) error. FIG. 6 illustrates these errors in an 8-bit wide example of a generic channel similar to HyperTransport. The data line error is often permanent and caused by either an open or shorted signal on an ASIC, pc board or cable. Electrical noise, inter-symbol interference or alpha particles can cause the window or single symbol error. They are all transient in nature and can be recovered via a single retry. The clock or frame error is more likely caused by a systematic problem such as clock jitter, clock insertion delay margin or clock or signal skew. Frame errors are less likely to be transient in nature but may still be recoverable. Channel designers recognize the hard failure mode regarding line errors but resign to the recovery of only soft (transient) errors. Hard failures require these systems to de-configure processors out of fabrics, utilize spare or redundant planes of fabric or go down for emergency maintenance. HyperTransport error recovery relies on an ARQ algorithm utilizing a 32-bit CRC for error detection without the capability of error correction.

BRIEF DESCRIPTION OF THE DRAWING

FIGS. 1A–E are diagrams showing three configurations of the same codeword useful in the explanation of the error correction method and the two-dimensional erasure recovery method via couplet mirroring.

FIGS. 2A–D are diagrams showing a serial ECC calculation method plus binary logic equations for translating data to ECC and ECC to data.

FIG. 9 is a diagram of an example 8-byte data packet followed by its complementary 8-byte ECC packet.

FIGS. 10 and 10A are diagrams of the data and ECC packets of FIG. 9 with transmission errors and how they are self-corrected.

FIG. 13 is a diagram showing example 32-byte packets with format optimized for accomplishing multiple data line erasure recovery and two random bit per codeword error correction.

FIGS. 14 and 14A are diagrams showing the data and ECC packets of FIG. 13 with transmission errors and those errors self-corrected.

FIG. 18 is a diagram showing a two-dimensional encoded data field of an array of arrays.

FIG. 19 is a flow chart for encoding codeword records.

FIG. 20 is a flow chart for decoding codeword records.

FIG. 21 is a flow chart for reconstructing a disk drive record.

Figure 1D:
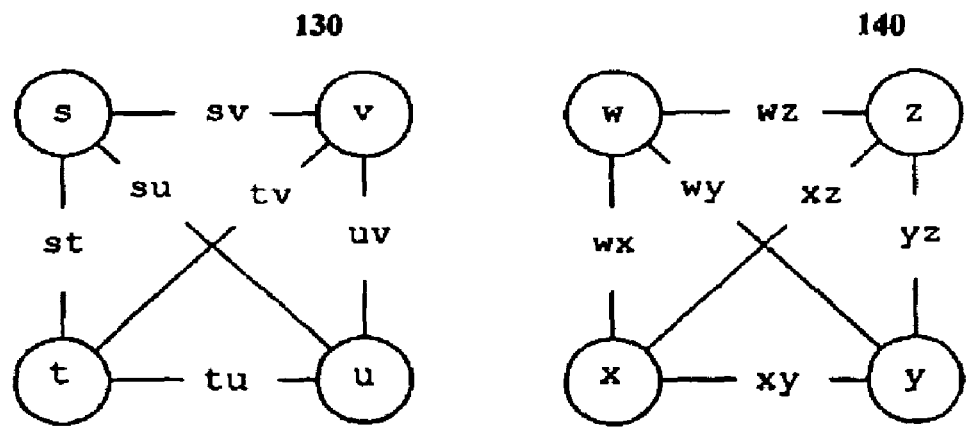

Table 1. Codewords denoted as row elements.

Table 2. Decoding lookup translation table for row couplets.

Table 3. Codewords denoted as column elements.

Table 4. Decoding lookup translation table for column couplets.

Table 5. is the error pattern table for the 16 single bit random errors and 120 double bit random errors.

DETAILED DESCRIPTION OF THE PREFERRED EMBODIMENT

FIG. 1 shows the layout of the data byte and the ECC byte. It should be noted that for the development of the code right most significant data orientation was used. It is an object of the invention that the method can be classified as endian neutral. Data within arrays and tables can be flipped without changing the mathematics.

It is noted by Berlekamp that the factors of $Q^{(17)}(x)$ are a pair of degree 8 irreducible self-reciprocal polynomials capable of performing error correction. These factors are $g1(x)=1+x^3+x^4+x^5+x^8$ and $g2(x)=1+x+x^2+x^4+x^6+x^7+x^8$. While each of these irreducible polynomials work equally well the patent application will nominally refer to $g1(x)$. The ECC byte is determined by dividing the data byte by one of the irreducible polynomials $g1(x)=1+x^3+x^4+x^5+x^8$ and multiplying by $x^8$. The register labeled 200 is first cleared to all zeros prior to the operation. Each data byte is divided by the polynomial $g1(x)=1+x^3+x^4+x^5+x^8$ and multiplied by $x^8$ by inputting the data byte serially into the $x^8$th exclusive-or position 201, of the 8-bit feedback shift register labeled 200. The residual data, after all 8-bits are input becomes the ECC value. The example in FIG. 2 is for data byte 9C hexadecimal. The resultant ECC after 8 shifts is 80 hexadecimal. Field 7 of Table 2 and Table 4 is a listing for all ECC values. Once the table is developed it can be used for software or firmware implementations without the need for the regeneration of ECCs. The summation of the contributing data terms for each EGG term results in a set of equations translating data to ECC. For hardware applications the ECC can also be evaluated more efficiently via these boolean logic equations also shown in FIG. 2D item 210. In a similar process the equations can be generated that translate EGG bits to data bits. These are noted in FIG. 2D item 220.

It is desirable for the error control code to provide robust data integrity and for data to be verified/validated at a micro level to a known criteria. This is of particular value to the financial industry that is held accountable for mistakes. Data is validated at the byte level to the limit of the error detection specifications of the ECC as noted. The two polynomials expressed as examples have marginally different error detection characteristics.

In general for the best codes with codeword length=n, information bits=k and Hamming distance=d the following is true:

For short codes the code will detect all error bursts of length=k. The composite method will: detect t=d−1 random bits in error; detect all odd number of bits in error; and correct t=(d−1)/2 random bits in error.

The Hamming distance noted by Berlekamp for the invention's preferred ECC is d=5. Therefore each codeword for this invention will have the following set of known mathematical capabilities: detect all data bytes in error, k=8; detect t=5−1=4 random bits in error; detect all odd number of bit errors; correct t=(5−1)/2=2 random bits in error; and correct a single data bit in error simultaneously with a single ECC bit in error.

Each codeword can self detect and self correct errors per the following procedure:

a) A data byte is input
b) The corresponding ECC byte is either evaluated by equations of FIG. 2 item 210 or read from Table 2 or 4
c) The ECC byte is input
d) The evaluated ECC byte and the read ECC byte are subtracted via the exclusive-or logical operation
e) If the syndrome (difference) is zero, the byte is assumed to be correct
f) If the syndrome is non zero, the error pattern is read from Table 5 addressed by the syndrome.
g) Errors in both the data and ECC bytes are corrected by subtraction, via exclusive-oring the error pattern with the respective codeword. For instructional purposes the error pattern in Table 5 is noted as $d_j$, $d_k$, $e_j$ and $e_k$ where d=data byte, e=ECC byte and j and k=codeword bit positions.

In the actual operational table they are simply 1 bits in the codeword positions that require exclusive-or bit toggling to effect correction.

It is also desirable to keep a part of each codeword packet a copy of the original clear data. Some users and application developers distrust methods that modify users' data fearing potential data loss or corruption. The invention has the option of using the ECC byte as a mirrored "proxy" for the data, which can be translated to clear data whenever desired. There is a one to one translation between data and ECC so there is little chance for loss or corruption if used in this manner. The data byte and ECC byte can be configured into 4 bit×4 bit codeword arrays and dispersed in either row, column or both dimensions and when viewed as an array the method can also perform dual 4-bit row or column erasure recovery. It is shown that for each codeword there are 12 possible combinations of row and column elements called couplets capable of mirroring the data byte. See FIG. 1 item 120 showing the codeword in array form. The rows are labeled s, t, u and v and are called hexadecimal row values or row elements. The columns are labeled w, x, y and z and are called hexadecimal column values or column elements.

Given a data byte [Di]=d0d1d2d3d4d5d6d7 construct an ECC byte [Ei]=e0e1e2e3e4e5e6e7 via the self-reciprocal irreducible polynomial $g1(x)=1+x^3+x^4+x^5+x^8$ or $g2(x)=1+x+x^2+x^4+x^6+x^7+x^8$. The codeword for each data byte becomes [CWi]=[Di][Ei] =d0d1d2d3d4d5d6d7e0e1e2e3e4e5e6e7 where i is the ith information byte in the datagram. With ts=the data byte and vu=the ECC byte and st,su,sv, tu,tv, and uv, are row couplets mirroring the data byte [Di]=st and wx, wy, wz, xy, xz and yz are column couplets also mirroring the data byte [Di]=st. [Di] is found by boolean evaluation or table look-up method given any row or column couplet. It can be said that all couplets mirror all other couplets. Via the inherent capability of the ECC all codewords [CWi]=[Di][Ei] have self error detecting capabolity. Via the inherent capability of the ECC all codewords [CWi]=[Di][Ei] have 2-bit random error correcting capability.

FIG. 1D diagram item 130 illustrates the possible pairing of the row values. Consider these the pairings that are available when any two of four rows are removed from the array. The six row pairings st, su, sv, tu, tv and uv are called row couplets. Note that the original data couplet is ts and the original ECC couplet is vu.

FIG. 1D diagram item 140 illustrates the possible pairing of the column values. Consider these the pairings that are available when any two of four columns are removed from the array. The six column pairings wx, wy, wz, xy, xz and yz are called column couplets. Note that the original data and ECC are dispersed equally across all four columns. Note that both row and column couplets are also byte quanta size.

Figure 1E:
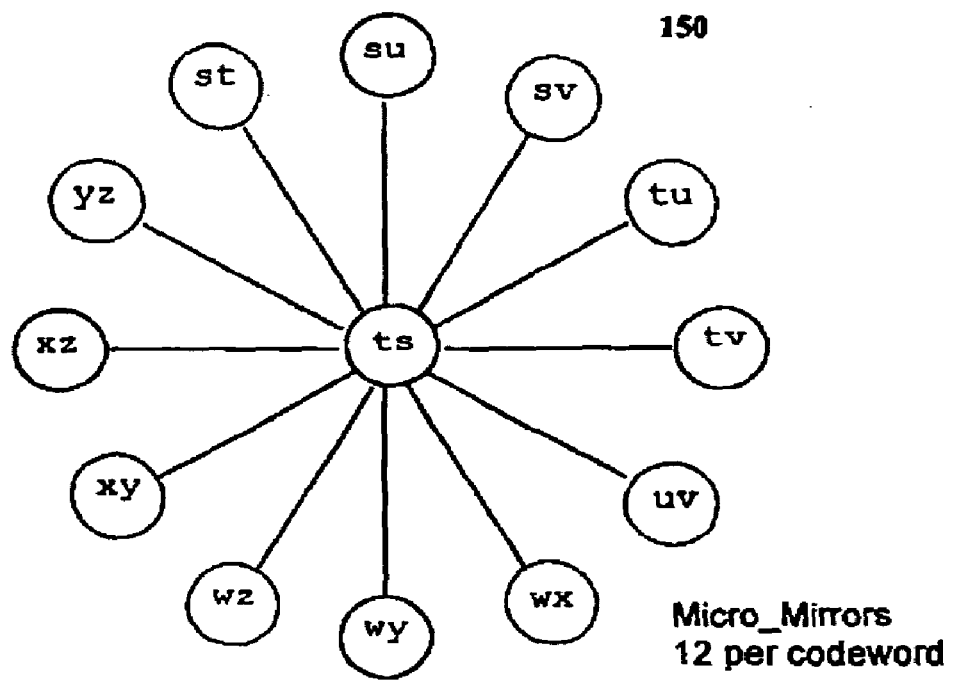

FIG. 1E diagram item 150 illustrates that the data byte has 12 "mirrors" that given their identity can be used to uniquely specify the data byte. For that matter they can specify any other row or column couplet of the same data byte. Table 2 is the decoding table for row couplets and Table 4 is the decoding table for column couplets. Addressing the appropriate table with the row or column couplet value produces the original data byte and/or ECC byte. This provides both the erasure decoding and reconstruction methods.

While the table look-up method is likely preferred for software or firmware implementations, applications that can embed boolean translations into integrated circuits or programmable logic arrays can achieve the fastest possible line speeds. FIG. 2 shows the construction of the ECC by the serial division method and also via eight boolean equations 210 that evaluate equivalent ECC results. A second set of eight equations 220 translate ECC bytes back to data values. The eight ECC equations 210 can be used to construct four other sets of eight equations that translate row couplets to corresponding data byte values and six other sets of eight that translate column couplets to corresponding data byte values.

Consider the codeword in array form. If we know wx=d0d4 e0e4 d1d5 e1e5 we can find yz=d2 d6 e2 e6 d3 d7 e3 e7 by combination and substitution using the ECC equations of FIG. 2 item 210. Similarly all ten sets of eight equations can be developed. The ECC is found by dividing the data byte by the irreducible symmetric polynomial $g1(x)=1+x^3+x^4+x^5+x^8$. The circuit depicted in FIG. 2A is a feedback shift register with exclusive-or gates in positions 3,4,5 and 8. A faster method is also shown tat evaluates all 8 bits in parallel.

The ECC values for all 256 possible data bytes can be computed once and saved in a list or table for look-up. They are summarized as follows for columns and rows.

For $G1(x)=1+x^3+x^4+x^5+x^8$

Given the data byte, the error control code byte can be evaluated via the following set of equations.

$e0=d0+d3+d4+d5+d6$ $e1=d1+d4+d5+d6+d7$ $e2=d2+d5+d6+d7$ $e3=d0+d4+d5+d7$ $e4=d0+d1+d3+d4$ $e5=d0+d1+d2+d3+d6$ $e6=d1+d2+d3+d4+d7$ $e7=d2+d3+d4+d5$

Given the error control code byte, the data byte can be evaluated via the following set of equations:

$d0=e2+e3+e4+e5$ $d1=e0+e3+e4+e5+e6$ $d2=e1+e4+e5+e6+e7$ $d3=e3+e4+e6+e7$ $d4=e0+e2+e3+e7$ $d5=e0+e1+e2+e5$ $d6=e0+e1+e2+e3+e6$ $d7=e1+e2+e3+e4+e7$

Data can be evaluated from column couplets (for generator polynomial $g1(x)=1x^3+x^4+x^5+x^8$):

[The plus sign, +, denotes the exclusive-or boolean logic operator, d are binary data bits and e are binary ECC bits]

$d0=d0wx,wy,wz$ or $(d1+d5+e1+e5+e6)xy$ or $(d7+e1+e5+e7)xz$ or $(d2+d3+d7+e3+e7)yz$ $d1=d1wx$ or $(d0+e0+e2+e6)wy$ or $(d0+d3+d4+e4)wz$ or $d1xy$ or $d1xz$ or $(d2+d6+e2+e6+e7)yz$ $d2=(d1+d4+d5+e0+e5)wx$ or $d2wy$ or $(d0+d3+d7+e3+e7)wz$ or $d2xy$ or $(d3+e1+e3+e5)xz$ or $d2yz$ $d3=(d0+d1+d4+e4)wx$ or $(d4+e0+e2+e4+e6)wy$ or $d3wz$ or $(d2+d5+d6+e1+e6)xy$ or $d3xz,yz$ $d4=d4wx,wy,wz$ or $(d1+d2+e1+e2)xy$ or $(d5+e1+e3+e5+e7)xz$ or $(d3+d6+d7+e2+e7)yz$ $d5=d5wx$ or $(d0+d6+e2+e4+e6)wy$ or $(d0+d4+d7+e3)wz$ or $d5xz$ or $(d2+d6+d7+e2)yz$ $d6=(d1+d5+e0+e4)wx$ or $d6wy$ or $(d3+d7+e0+e3)wz$ or $d6xy$ or $(d1+d7+e3+e5+e7)xz$ or $d6yz$ $d7=(d4+e0+e1+e4)wx$ or $(d0+d2+e4+e6)wy$ or $d7wz$ or $(d2+d5+d6+e2)xy$ or $d7xz,yz$

Data can be evaluated from row couplets (for generator polynomial $g1(x)=1+x^3+x^4+x^5+x^8$):

$d0=d0st,su,sv$ or $(d4+d5+d7+e3)$ tu or $(d4+d6+d7+e5e6)tv$ or $(e2+e3+e4+e5)uv$ $d1=d1st,su,sv$ or $(d4+d5+d6d7+e1)$ tu or $(d5+d7+e6+e7)tv$ or $(e0+e3e4+e5+e7)uv$ $d2=d2st,su,sv$ or $(d5+d6+d7+e2)tu$ or $(d4+d6+e4+e5)tv$ or $(e1+e4+e5+e6+e7)uv$ $d3=d3st,su,sv$ or $(d6+d7+e0e3)tu$ or $(d5+d6+e4+e5+e7)tv$ or $(e3+e4+e6+e7)uv$ $d4=d4st$ or $(d1+d2+e1+e2)su$ or $(d0+d1+d3+e4)sv$ or $d4tu,tv$ or $(e0+e2+e3+e7)uv$ $d5=d5st$ or $(d2+d3+e0+e2+e3)su$ or $(d0+d1+d2+e4+e7)sv$ or $d4tu,tv$ or $(e0+e1+e2+e5)uv$ $d6=d6st$ or $(d0+d1+e1+e3)su$ or $(d0+d1+d2+d3+e5)sv$ or $d4tu,tv$ or $(e0+e1+e2+e3e6)uv$ $d7=d7st$ or $(d0+d1+d3+e0+e1)su$ or $(d0+d2+e4+e6)sv$ or $d4tu,tv$ or $(e1+e2+e3+e4+e7)uv$

For $G2(x)=1+x+x^2+x^4+x^6+x^7+x^8$

Given the data byte, the error control code can also be evaluated via the following set of equations.

$e0=d0+d1+d3+d6$ $e1=d0+d2+d3+d4+d6+d7$ $e2=d0+d4+d5+d6+d7$ $e3=d1+d5+d6+d7$ $e4=d0+d1+d2+d3+d7$ $e5=d1+d2+d3+d4$ $e6=d0+d1+d2+d4+d5+d6$ $e7=d0+d2+d5+d7$

Given the error control code byte, the data byte can be evaluated via the following set of equations.

$d0=e0+e2+e5+e7$ $d1=e1+e2+e3+e5+e6+e7$ $d2=e3+e4+e5+e6$ $d3=e0+e4+e5+e6+e7$ $d4=e0+e1+e2+e6$ $d5=e0+e1+e2+e3+e7$ $d6=e0+e1+e3+e4+e5+e7$ $d7=e1+e4+e6+e7$

Data can be evaluated from row couplets (for generator polynomial $g2(x)=1+x+x^2+x^4+x^6+x^7+x^8$):

[The plus sign, +, denotes the exclusive-or boolean logic operator, d are binary data bits and e are binary ECC bits]

$d0=d0wx,wy,wz$ or $(d2+d6+e1+e2+e5+e6)xy$ or $(d5+e1+e3+e5)xz$ or $(d6+d7+e2+e3+e6+e7)yz$ $d1=d1wx$ or $(d6+e0+e2+e4+e6)wy$ or $(d0+d7+e0+e3+e4+e7)wz$ or $d1xy$ or $d1xz$ or $(d2+d7+e2+e6)yz$ $d2=(d0+d1+e0+e1+e4+e5)wx$ or $d2wy$ or $(d3+e0+e3+e7)wz$ or $d2xy$ or $(d7+e1+e3+e5+e7)xz$ or $d2yz$ $d3=(d0+d4+e0+e1+e4)wx$ or $(d0+e2+e4+e6)wy$ or $d3wz$ or $(d2+d5+e1+e2)xy$ or $d3xz,yz$ $d4=d4wx,wy,wz$ or $(d1+d5+e1+e2+e5)xy$ or $(d1+d3+d7+e1+e3+e7)xz$ or $(d2+d6+e2+e7)yz$ $d5=d5wx$ or $(d0+d2+d4+e0+e2+e4)wy$ or $(d0+d3+d7+e0+e3)wz$ or $d5xy$ or $d5xz$ or $(d2+d6+e2+e3+e6)yz$ $d6=(d1+d4+e1+e4)wx$ or $d6wy$ or $(d3+e3+e4+e7)wz$ or $d6xy$ or $(d1+d5+d7+e3)xz$ or $d6yz$ $d7=(d0+d4+e4+e5)wx$ or $(d2+d6+e0+e4)wy$ or $d7wz$ or $(d1+d2+e2+e4)xy$ or $d7xz,yz$

Data can be evaluated from column couplets (for generator polynomial $g2(x)=1+x+x^2+x^4+x^6+x^7+x^8$):

ti $d0=d0st,su,sv$ or $(d4+d5+d6+d7+e2)tu$ or $(d4+d7+e4+e5)tv$ or $(e0+e2+e5+e7)uv$ $d1=d1st,su,sv$ or $(d5+d6+d7+e3)tu$ or $(d4+d6+d7+e6+e7)tv$ or $(e1+e2+e3+e5+e6+e7)uv$ $d2=d2st,su,sv$ or $(d4+d5+d6+e0+e3)tu$ or $(d4+d5+e4+e5+e7)tv$ or $(e3+e4+e5+e6)uv$ $d3=d3st,su,sv$ or $(d4+d6+e0+e2+e3)tu$ or $(d4+d5+d6+d7+e4+e6)tv$ or $(e0+e4+e5+e6+e7)uv$ $d4=d4st$ or $(d0+d1+e2+e3)su$ or $(d1+d2+d3+e5)sv$ or $d4tu,tv$ or $(eo+e1+e2+e6)uv$ $d5=d5st$ or $(d2+d3+e1+e2)su$ or $(d1+d3+e4+e7)sv$ or $d4tu,tv$ or $(eo+e1+e2+e3+e7)uv$ $d6=d6st$ or $(d0+d1+d3+e0)su$ or $(d0+d1+e4+e5+e7)sv$ or $d4tu,tv$ or $(eo+e1+e3+e4+e5+e7)uv$ $d7=d7st$ or $(d0+d2+e0+e1+e2+e3)su$ or $(d0+d1+d2+d3+e4)sv$ or $d4tu,tv$ or $(e1+e4+e6+e7)uv$

These two sets of equations become a mathematical proof of the dual erasure capability of the error control method. They show that given any two elements (rows or columns) and the initial ECC equations the remaining two elements can be evaluated by algebraic methods. In a hardware logic design the terms in each of the eight lines are evaluated with 5-input exclusive-or gates and multiplexed via a 6-input mux. Both the column and row implementations require only 24 5-input exclusive-or gates and eight 6-input muxes. In a single dimensional application such as a RAID storage design only the column or row design would be needed. This is extremely efficient logic to accomplish dual erasure recovery.

A second exhaustive proof can be realized by constructing from FIG. 1 two large 16×16 arrays of 256 item 130s (for row dimension proof) and 256 item 140s (for column dimension proof). Label the items within each large array from 0 to FF. Take from each codeword array, 00–FF, the 6 row and 6 column couplets and mark those elements complete in their respective positions on the corresponding items of the two large arrays. When complete there will be no free positions-and no duplicate (double marked) positions on the items. This proves that each couplet is unique for it's identity (position) and dimension (row or column). All 1536 couplets in each large array are unique. Therefore there are 12×256 or 3072 unique mirrors for the overall code of 256 information symbols.

A significant object of the invention is to complement the erasure recovery method of utilizing an identical ECC polynomial and identical codeword construction, with the random bit error correction capability. This provides solutions to systems, which may be disposed to both erasure and/or random error modes, a composite and complete error control recovery procedure.

Consequently both error correction and erasure recovery can simultaneously be integrated into most application solutions. These byte level micro-mirrors outperform conventional mirroring in that each byte and its ECC mirror can self-detect and self-correct random errors. And when codeword arrays are dispersed in row or column direction or arrayed in two dimensions any one of twelve mirrored couplets can self-recover the data byte provided the identity of the couplet is determined. The invention outperforms conventional mirroring again by recovering all dual erasure combinations within four elements of a codeword. This enables many new kinds of erasure recovery including new RAID methods and new disaster resistance and disaster recovery methods. It is noted that the ECC byte also provides superior and quantitative error detection capability.

Another object of the invention is to minimize the amount of computation for encoding, decoding and reconstruction when the correction and erasure logic can't be implemented in hardware logic. A simple table lookup procedure can efficiently perform the encode, decode and reconstruction processes. A 256-word×16-bit translation table is used for encoding and a 256-word by 64-bit table is used for ECC translation and the decode of all erasure corrections. When tables are used no logic or arithmetic operations are required as the entries represent final results.

While specific new implementations may prefer to integrate the inventions boolean equations into application specific:logic-it is possible to retrofit existing systems with a total software or firmware implementation. It is an object of the invention that both software table lookup and hardware boolean logic implementation methods are available.

It is an object of the invention that degree 8 polynomials other than those noted could be used to obtain very similar results. It is an object of the invention that hardware implementations make use of the boolean equations noted earlier in the summary for encoding, decoding and reconstruction. Different equations with very similar capabilities exist when using the polynomial $g2(x)=1+x+x^2+x^4+x^6+x^7+x^8$ or other capable polynomials. It is also noted that the codewords can be arranged in different configurations without changing the overall capabilities.

It is essential to compare this to conventional mirroring. Consider mirroring a single data byte A with a duplicate byte A'. If a bit in both A and A' becomes corrupted it would be inherently impossible to know which byte, A or A', is correct. In fact neither would be correct. Now consider the new method with data byte A and it's mirrored ECC byte B. Again assume that a bit becomes corrupted in both A and B. Now bring A and B together and they self-determine that error(s) exist then self-correct the error bit in each byte. A mirrored data file can do this for each successive data byte. Likewise mirrored devices can be compared and errors corrected at the sector or block level. These capabilities are objects of the invention.

Also consider two storage devices A and B conventionally mirrored with two other devices A' and B'. There are now four devices; A, A', B and B'. Should two devices fail there are six possible failure combinations; AA', AB, AB', A'B, A'B' and BB'. Two of these combinations AA' and BB' will result in lost data. The invention hasn't any such limitations. Any two of four units can incur catastrophic failure without loss of data plus multiple units can incur numerous random errors that can be error corrected at the byte level. These too are objects of the invention.

Since certain mission critical applications rely on triplicate redundancy for resiliency it is imperative to compare with the inventions data array extended via a second ECC byte (qr) as follows:

[Di][E2i]=m n o p {m-p, hexadecimal column values}
[E2i] f4f5f6f7 q {q-v,hexadecimal row values}
    f0f1f2f3 r
[Di] d0d1d2d3 s
    d4d5d6d7 t
[E1i] e0e1e2e3 u
    e4e5e6e7 v
   ‾ ‾ ‾
[Di][E1i]=w x y z {w–z, hexadecimal column values}

Consider a dual-element data set [st] conventionally mirrored by two additional data sets [uv] and [qr]. A system with this much redundancy must anticipate more than two potential failures before corrective reconstruction can be scheduled. Consider the effects of three and four failures. Clearly five failures within a six element system results in a catastrophic loss of data. For conventional triplicate redundancy there are two combinations of three failures out of the 20 possible combinations that would result in a catastrophic loss of data. They are [suq] and [tvr]. Likewise there are 6 combinations of four failures out of the 15 possible combinations that would also result in a catastrophic loss of data. They are [tvqr], [tuvr], [suqr], [suvq], [stvr] and [stuq]. Simple triple redundancy appears to have substantial mathematical deficiencies with eight failing combinations.

The invention can disperse rows q, r, s, t, u and v and recover all but three combinations of 1,2, 3 and 4 element failures. Random dual bit error correction and data validation is possible as with the inventions four element dispersal method. It is also an object of the invention to pennit dispersal of 4-bit column elements m, n, o and p.

Another object of the invention is that it can be used for disaster recovery data protection with approximately the same simplicity and efficiency as RAID-1 mirroring. Mirroring for disaster recovery often includes RAID-1 mirroring of RAID level 3 or 5 arrays. This reduces conventional mirroring efficiency to approximately 40%. The invention's efficiency remains at 50% for the four-element dispersal method with micro-level dual erasure and dual random bit correction functionality.

It is possible to shorten the array by removing either a row or a column limiting the dispersal to three channels or devices and the erasure capability to one element. This is comparative to RAID-3 or RAID-5. Positive attributes include an increase in efficiency to 67% and an increase in inherent array reliability due to one less device.

The encoding of the three element codeword array is exactly the same as for the four element codeword array with a row or column removed. For explanatory purposes assume the array has the first three rows "s", "t" and "u". The "v" row is left off. Included are the data byte and half of the ECC byte. The array size is now 3×4 bits.

There are two methods for single erasure recovery. The first is exactly as with the four element array where if only one element is identified to be in error or missing a fourth is also assumed missing as two available elements are necessary and sufficient to effect erasure recovery of two missing elements. The missing element and the last row, the "v" element, could both be assumed to be missing. Either the equations or the Table look-up procedure recovers the original data byte and/or codeword.

One of the preferred embodiments is a double rank of four devices. The data bytes are accumulated and stored on the first rank and the ECC bytes are accumulated and stored on the second rank. An object of the invention is that the recording of the ECC bytes can be disjoint from the data and can lag the recording of the data bytes. This permits separate sectors and files to be recorded on single devices like RAID-5 data. There are of course consistency issues that have to addressed when operating in this manner. This is also possible in a four-device array utilizing row dispersal.

And yet another object of the invention is a dispersal method that leaves insufficient data on any single disk or perhaps at any single site for a potential security breach if a device were to fall into the wrong hands. The return of broken disk drives for repair or replacement can put secure data at risk. The invention disperses only 2 data bits and 2

ECC bits in each codeword element for column dispersal and either 4 data bits or 4 ECC bits in each codeword for row dispersal.

Another object of the invention is to achieve fast random access to data across a 4-wide disk array by reading the first 2 of 4 disk drives to access distributed data. Original data can then be recovered faster by translation than by waiting out the latency of the remaining two units.

A further object of the invention is a disk array optimized for dealing with the bathtub reliability curve for disk drives. It is known that the reliability of disk drives is lower in the first months or few years of operation, rises to a plateau for most of the remaining life then falls off rather abruptly as it approaches end of life. A 4-drive array capable of handling dual erasures can optimize data center costs and availability by configuring 2 new or older units with 2 mid-life high reliability units. When the older units near end-of-life, they are replaced by new units in this phased approach.

A further object of the invention is that the codeword packet can be developed over time and stored in dispersed locations and on disparate media. For instance the data bytes could be stored on disk drives for fast random access performance and the ECC bytes could be on tape. Another strategy is to have the data bytes on disk and the complete codeword distributed across 4 tape cartridges. Reading any two tape cartridges successfully would recover data bytes lost on tape or disk. Backup to tape could occur overnight when the disk files see potentially less activity and snapshots of data are easier.

Another object of the invention is to allow discretionary use of the method permitting it to coexist on other arrays such as RAID-0 or RAID-1 JBOD Oust a bunch of disk) arrays. The attribute of encoding 2-byte codewords that can optionally be divided into two parts and stored separately maximizes this flexibility.

While the present invention consistently shows a data byte distributed equally across all four elements of an array it is not the intention of the invention to restrict higher level hardware, software or firmware from distributing records, sectors, files or data bases onto individual elements of the array. The invention simply makes it possible to distribute each byte over the array for security concerns.

Another object of the invention is that data can be dispersed to four devices then during read back the four data segments are assessed as to which devices need recovery and whether the error correction or the erasure recovery method should be used. Also it may be advantageous that device groups can fluctuate between two and four units as resiliency requirements change. In a virtualized system all devices can be non-arrayed and the application or file system decide on the resiliency level and choose to disperse data to two, three or four devices. Also it may be advantageous to migrate data first to two devices, one containing data and the other ECC bytes then later migrate data to "s" and "t" devices and ECC to "u" and "v" devices.

It is also an object of the invention that the combination of flexible mirroring attributes, multiple polynomial choices and error correction and dispersal capabilities could lend the technology useful for cryptographic coding.

Yet another objective of the invention is that it have the flexibility to correct error bytes or erasure bytes when the codeword elements are dispersed across other than 4 channels. One object is to correct single bursts or erasures when long sequences of w, x, y and z column elements are concatenated in series on a serial channel. Consider sequences of Nw+Nx+Ny+Nz codeword column elements where N is the expected burst error length. A CRC is optional at the end of each element sequence in order to help identity sequences in error. The receiver can tolerate any two sequences out of four being missing or unreadable thus recovering either from long burst errors or errors that straddle segment boundaries. An error burst that straddled the w and x sequences for instance would appear as 2N dual erasure errors. The serial scheme applies to serial copper and fiber-optic cable or wireless communications channels that experience periodic long error bursts. Data validation and transient error detection and correction capabilities all continue to work in the serial fashion.

A further preferred embodiment of this disclosure is a computer or storage network with both error detection and correction capability. Clusters of processors or devices are connected together via a system of routers and links. Links can be either serial or parallel in width and either copper or optical in media. An object of the invention is for the error control method to work for any link width. Note again FIG. 5, a sketch of a small computer fabric with network links.

A principal object of the invention is to provide an error correction method for channels that currently implement the ARQ, automatic retry on request, algorithm for error recovery. The most simplistic embodiment of this invention-permits an equal size retry packet of ECC bytes be transmitted on a negative acknowledge (NACK) and either be translated into data if transferred successfully or be used in conjunction with the previously received data packet for the error correction process.

A further object of the invention for ARQ recovery with error correction is that each data byte codeword can sustain multiple random errors that are correctable.

A further object of the invention for ARQ recovery with error correction is that it self-detect and self-correct for a permanent data line failure. This is quantified to a single bad line per each 8-bit width increment and can therefore be scaled to larger widths with more bad data lines. Note that when implementing the erasure method, along with ARQ, multiple line failures become recoverable.

A further object of the invention is to show that the same technique used to provide resiliency for a single network link can be implemented in a sequentially distributed manner to produce an active cable capable of self-detecting and self-correcting errors as they occur along its length.

An object of the invention for ARQ type channels with data packets formatted for erasure recovery as shown in FIG. 13 is that error correction can be executed on each assembled data/ECC byte pair at the receiver node.

Figure 11:
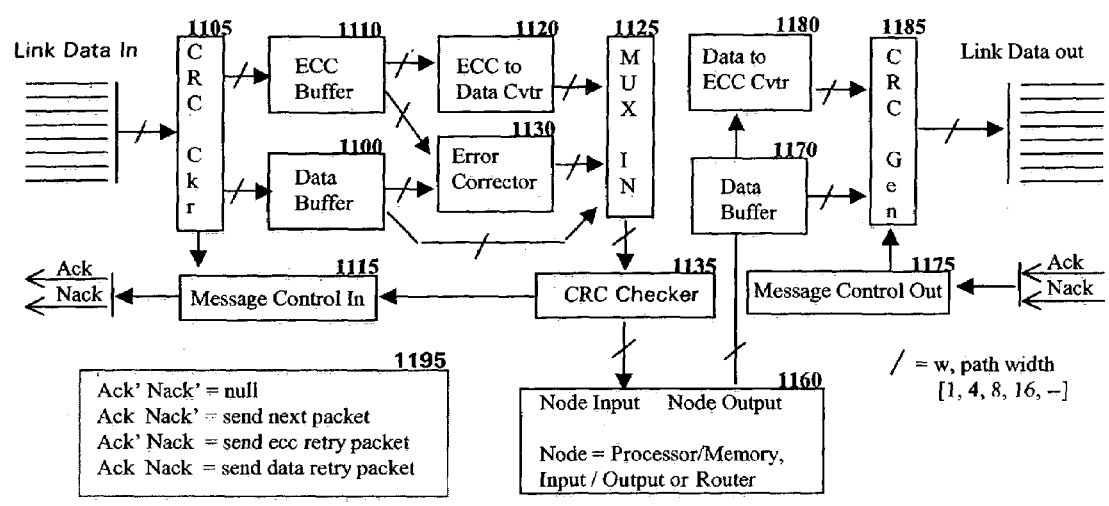
FIG. 11 is a block diagram showing the basic ARQ logic of FIG. 7 modified to accomplish error correction on retry.

An additional object of the invention for ARQ-type channels with data packets formatted for erasure recovery as shown in FIG. 11 is that-several permanent data lines can be recovered and error corrections can be implemented in a composite mode on the individual data/ECC codewords.

Sometimes it may be advantageous to disperse data across multiple physical links. It is an object of the invention that data dispersed across different links can be reassembled, verified/validated and even error corrected if necessary. This would be applicable for dispersed storage data or data transmitted within computer system fabrics as pictured in FIG. 17.

Another object of the invention is that data created at a processor or read from storage can be encoded once then be viable for error detection, error correction or data dispersal as required by various elements within the system other than the end points. The data can be moved about within the system or forwarded to: other systems and continuously be ready for validation, error correction or erasure recovery.

Yet another object of the invention is that pairs of 64-bit words made up of 8 data bytes and 8 ECC bytes respectively can be made resilient to memory chip failure. This is an example embodiment of the form of what is in general referred to as a Chip-Kill method permitting fail-safe operation after the catastrophic loss of a memory chip. 8-bit wide memory chips distribute all eight bit 0 bits to chip 0, all eight bit 1 bits to chip 1, all eight bit 2 bits to chip 2, etc. This is done separately for both the data and ECC words. If the chips are 16 bits wide connect all 16 bit 0 bits to chip 0, etc. Since the data/ECC codewords can self-detect up to 4 random bit errors and self-correct up to 2 random bit errors a single memory chip can fail without the loss of memory data. Even though the efficiency is only 50 percent a PC or data application that could run at half speed until maintenance is performed is better than no capability at all. The erasure recovery mode can also implement Chip-Kill but requires more special formatting of data.

Yet another object of the invention is the capability to construct both scalar and vector processor instructions to facilitate the fastest possible encode, decode, error detection, error correction, erasure recovery and codeword reconstruction. For the most complete end-to-end implementation for the sake of resiliency a processor should encode data just as it has been created and before it ever goes to memory. Special instructions can capture data within processor registers, encode the data into codewords and distribute the data to four separate sections of memory. In similar fashion processor instructions can read data from memory and evaluate data from ECC or dispersed codeword element pairs (couplets) and validate or perform error correction on retrieved codewords. At the receiving or retrieval end data should be decoded and evaluated at the last point and instance prior to being used. Special instructions would include a minimal functionality: set/select generator polynomial value(s); set/select dispersal mode; data byte and ECC byte, 4-bit row elements or 4-bit column elements; set/select function mode(s); validate, error correction, erasure recovery; generate codewords from data bytes and disperse to buffers in memory; merge received elements into couplets, evaluate desired couplet (nominally data) and write to memory; merge data and ECC fields, validate and/or correct random errors then write data and error pattern to memory; and merge received codeword, validate and/or correct random errors then-write data and error pattern to memory.

All in all it is an object of the invention to provide a concept for protecting data at a micro level that uses a unified composite capability that includes data validation, error detection, error correction, mirroring and erasure recovery. While the discussion is centered on byte quanta coding for flexibility and low cost of implementation the method should scale to other data sizes that are important to specific applications. Likewise ECC codes other than those identified here are also capable of producing similar results for erasure control and error correction.

Figure 3:
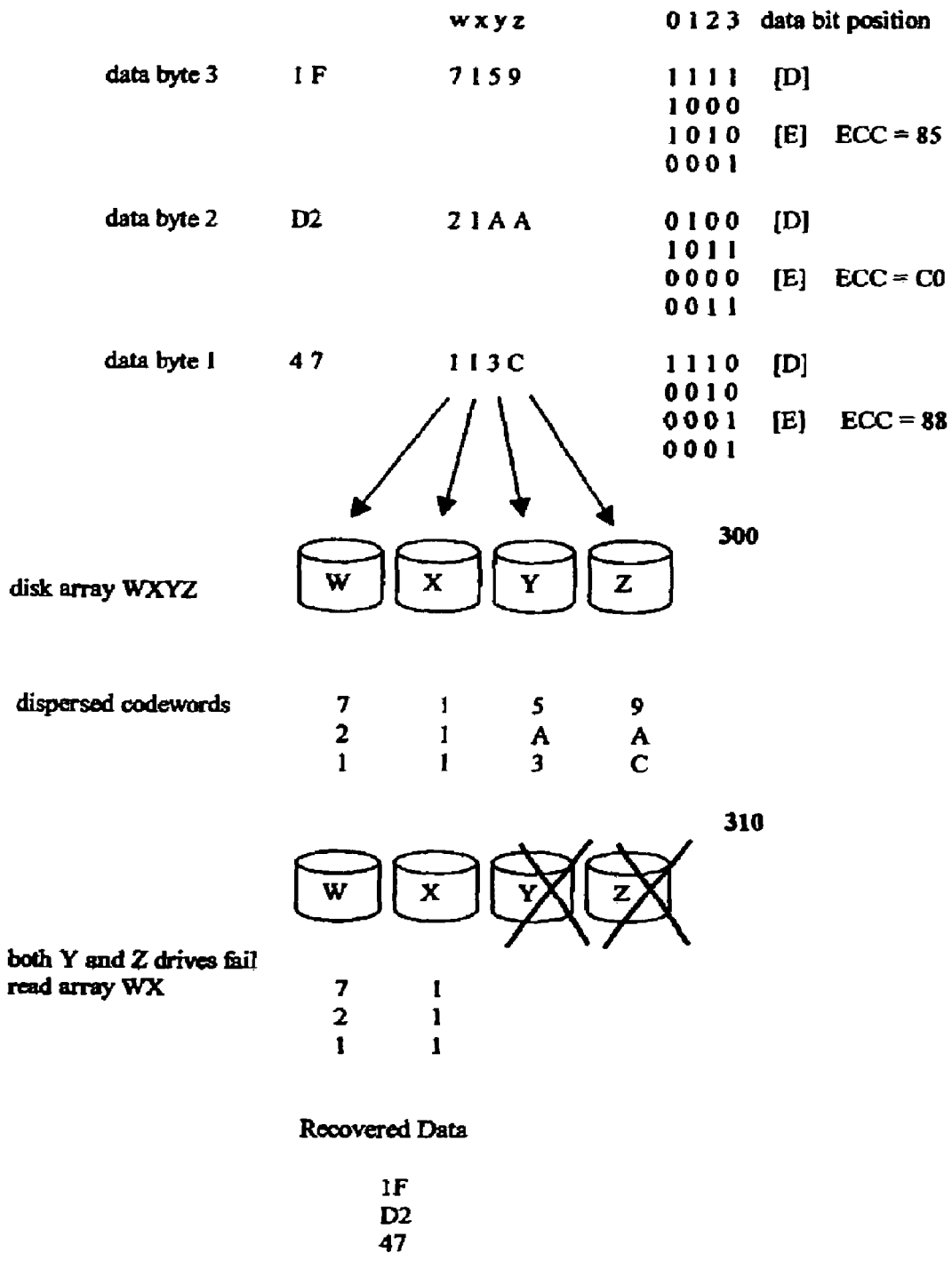
FIG. 3 is a diagram showing a four drive array of disks and an example of dual erasure recovery.

Refer to FIG. 3. An ultra reliable 4-drive disk array. The example in FIG. 3 is shown to be an array of four disk drives for ultra reliable mission critical storage applications. It could also be four data storage sites separated by hundreds of miles for disaster resistance/disaster recovery. In either case it also disperses data at the byte level potentially making the aggregate data more secure in order to avoid a natural, accidental or inflicted loss of critical data.

The example shows how three 8-bit data bytes are encoded, dispersed and recovered in the presence of dual element erasures. Two of the four devices/locations are assumed to become unavailable. The method works for any number of data bytes. In the disk drive example there would nominally be 256 or 512 bytes recorded on each physical device sector. In the case of data dispersal to remote storage sites data might be dispersed in encoded files that could range from the very small to the exceedingly large. The method of the invention works at the micro level, one byte at a time.

Refer to FIG. 1 and consider the data bytes configured into codeword arrays per item 120. In the example we will chose column dispersal. The 4-bit elements of the columns are labeled w, x, y and z. In column dispersal each dispersal element will contain two data bits and two ECC bits of the corresponding data byte. Note now that in FIG. 3 the disk drives in array, item 300, are also labeled w, x, y and z to correspond to the column elements of the codeword array.

The example data bytes are 47, D2 and 1F hexadecimal. Table 1 is addressed with 47 to obtain the 16-bit codeword 113C hexadecimal. A 1 (0001) is dispersed to drive w, another 1 (0001) is dispersed to drive x, the 3 (0011) is dispersed to drive y and the C (1100) is dispersed to drive z, item 300. The procedure is repeated for the second and third data bytes.

The four-drive array shown in item 310 with Xs across drives y and z noting that they have failed or are otherwise assumed to be unreliable or are perhaps not yet READY for the read operation. Within the four-drive array there are six combinations of possible drive pairings; wx, wy, wz, xy, xz and yz. If both drives y and z are unavailable then the pairing of drives w and x is the only choice. The data is read from drives w and x and assembled into the 8-bit wx couplet. The wx couplet is then used to access Table 2, field wx, for the corresponding mirrored data byte. For the first data byte couplet wx is 11 hexadecimal and produces 47 hexadecimal from Table 2, field wx. The process is repeated for the second and third data bytes. Dual erasure recovery has been achieved.

The fastest method for hardware logic designs are the column and row erasure equations listed in this section of the disclosure titled Data evaluated from column couplets using generator polynomial $g1(x)=1+x^3+x^4+x^5+x^8$. These equations can also be implemented via specialized scalar and vector processor programmed instructions. Since we know wx=d0 d4 e0 e4 d1 d5 e1 e5 we can find yz=d2 d6 e2 e6 d3 d7 e3 e7 by combination and substitution usi the EGO equations of FIG. 2 item 210. [The plus sign, +, denotes the exclusive-or boolean logic operator, d are binary data bits and e are binary EGC bits]. To evaluate couplet wx we use only the wx terms of the column evaluation logic terms listed above.

| | | |
|---|---|---|
| d0 = d0wx, wy, wz = | (1) = | (1) |
| d1 = d1wx = | (1) = | (1) |
| d2 = (d1 + d4 + d5 + e0 + e5) wx = | (1 + 0 + 0 + 0 + 0) = | (1) |
| d3 = (d0 + d1 + d4 + e4) wx = | (1 + 1 + 0 + 0) = | (0) |
| d4 = d4wx, wy, wz = | (0) = | (0) |
| d5 = d5wx = | (0) = | (0) |
| d6 = (d1 + d5 + e0 + e4) wx = | (1 + 0 + 0 + 0) = | (1) |
| d7 = (d4 + e0 + e1 + e4) wx = | (0 + 0 + 0 + 0) = | (0) |

Again we find the recovered data=47 hexadecimal and dual erasure recovery has been accomplished correctly.

When only a single unit becomes unavailable there are three choices for addressing the recovery table. If drive y were unavailable, then data from drives; wx, wz or xz could be used for data recovery. If the application's reliability requirement doesn't demand dual erasure capability an array of only three drives will suffice.

In the nominal case all four disk drives are fully operational and dual simultaneous read streams are possible using the dual recovery method to mirror two sets of clear data. When row dispersal is chosen no recovery is required for the st couplet pairing as it is the original clear data byte. This is a valuable attribute for data applications that are read intensive. A further performance attribute is the ability to read the first two of four devices to access data.

The reconstruction of data for rebuilding either one or two replacement devices is very simple relative to other methods. As with the recovery process previously explained the data from a minimum of two drives must be read successfully. Each successive couplet, either row or column, can be used to address the corresponding recovery table which will return the true data byte value. The data byte can then be used to address the codeword table, Table 1 or Table 3, which will return the whole codeword or it can address the recovery table to obtain the ECC byte. A separate table for 1-step reconstruction can be used that will return the codeword when addressed by the couplet. The codeword is then masked for the one or two row or column element for distribution to the respective drive(s) under reconstruction. The erasure recovery equations may again be the best implementation choice for hardware implementations. Specialized scalar or vector processor instructions using the boolean equations are also applicable.

Figure 4:
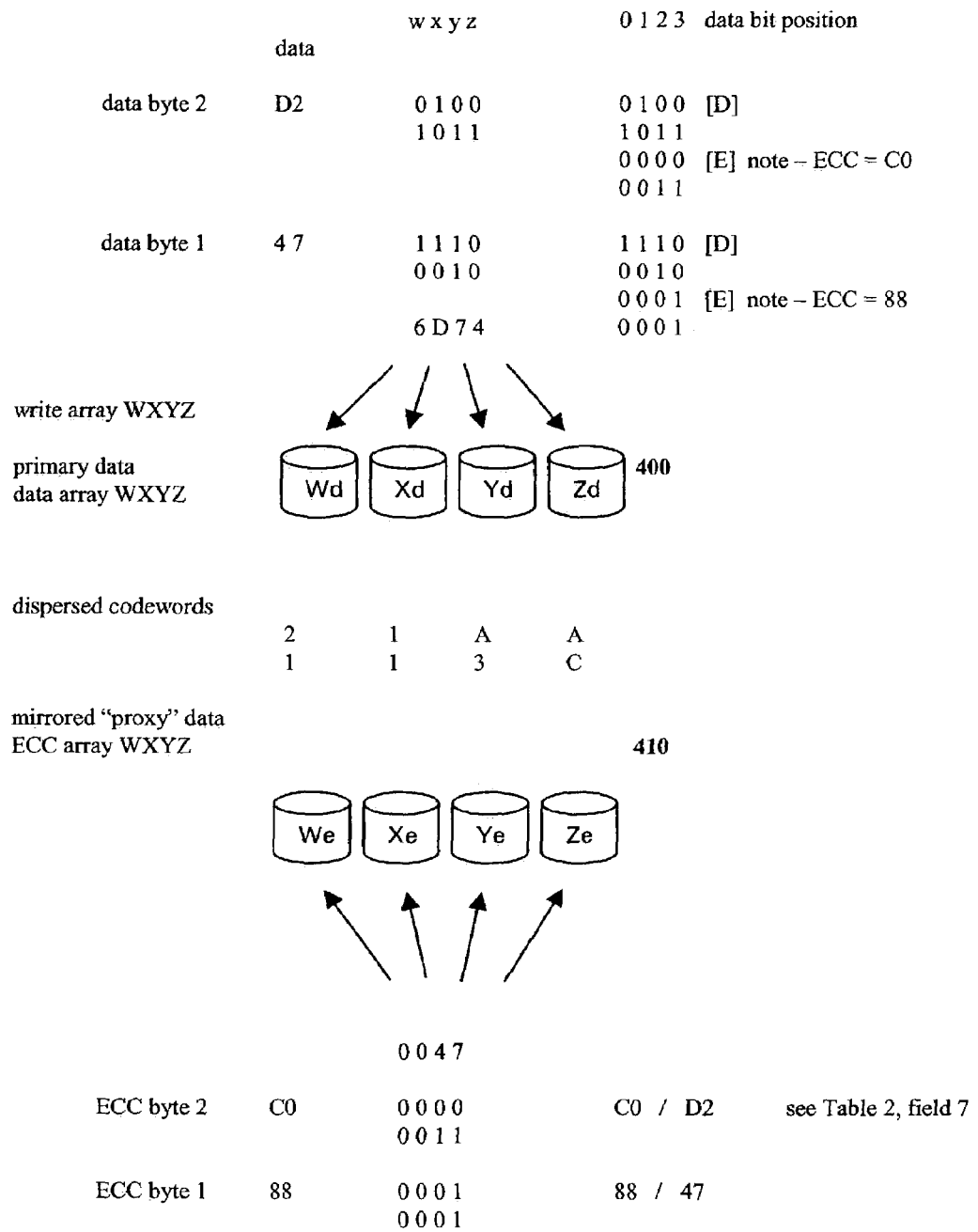
FIG. 4 is a diagram showing an 8 drive variation of the preferred embodiment shown in FIG. 3.

FIG. 4 illustrates an alternation of the preferred embodiment that disperses the data bytes on one rank of 4 disk drives and the ECC bytes on a mirrored second rank of 4 disk drives. There are no changes with regard to how the codeword is created. The first two rows of each codeword are distributed to the data drives and the second two rows are distributed to the ECC drives. Dual erasure correction will work using the same pointer methodology for identification of error free drive elements. As many as 4 of the 8 total drives may fail as long as the failures remain within the same two couplets of all codewords within the data block. The error correction is as flexible as the external pointer system that identifies the error free drives.

The data recovery process is somewhat more tedious for the 8-drive array as data from 4 drives need to be read in order to aggregate two ordered column couplets for the recovery procedure. Once the elements are assembled recovery proceeds as with the 4-drive array in FIG. 3. There are multiple advantages for segregating the data and ECC data bytes: the data bits are made more compact without the ECC bits interspersed thereby increasing the data bandwidth; the ECC sectors can be read as a mirrored "proxy" device; and reading both the Data and ECC drives simultaneously can double bandwidth and transactions per second when accessing different data. The ECC "proxy" bytes are translatable into corresponding data bytes. The ECC rank can be used for a fast "snap copy" or be remotely located as a disaster recovery measure.

The ECC rank can also be written on separate cylinders of the same disk drives or perhaps even recorded on different media such as tape depending on the application and the specific requirements. It is also possible to first record the data bytes and later (perhaps overnight) generate and record the ECC bytes. The combination of data bytes and ECC bytes enable the dual erasure and error correction capabilities regardless of the location of the two elements or the order and time in which they were created.

The preferred embodiment for the invention when used for disaster recovery of industrial and government databases would be to disperse the column elements of each codeword to four separate secure sites. No site would have sufficient information to recreate data. Any two sites or any site with reliable access to any two sites would have sufficient information to recover data. Any drive or media failure could possibly be discarded without concern of it causing a breach of security.

The present invention's attribute of both-column pair and row pair erasure correction affords a small set of data sharing rules. It is possible to allow users access to various row and column information such that they can share data with only certain other users.

The second primary embodiment of the invention adds data line failure resiliency and error correction to links of a scalable server or storage area network fabric. Consider the computer system fabric sketch of FIG. 5. Two 8-port routers, 500 and 510, realize a single plane fabric capable of interconnecting processor nodes off both routers. In order to multiplex memory transfers between all processors it is necessary to restrict transfer size so that control information and short message latency is minimized. Even in this small system as many as three links exist between processor nodes. In large systems the maximum "hop" count will likely be several times greater. In order to keep recovery and error control manageable link errors are typically managed at the link level using Automatic Retry Request, ARQ, procedure for transient error recovery.

Figure 5:
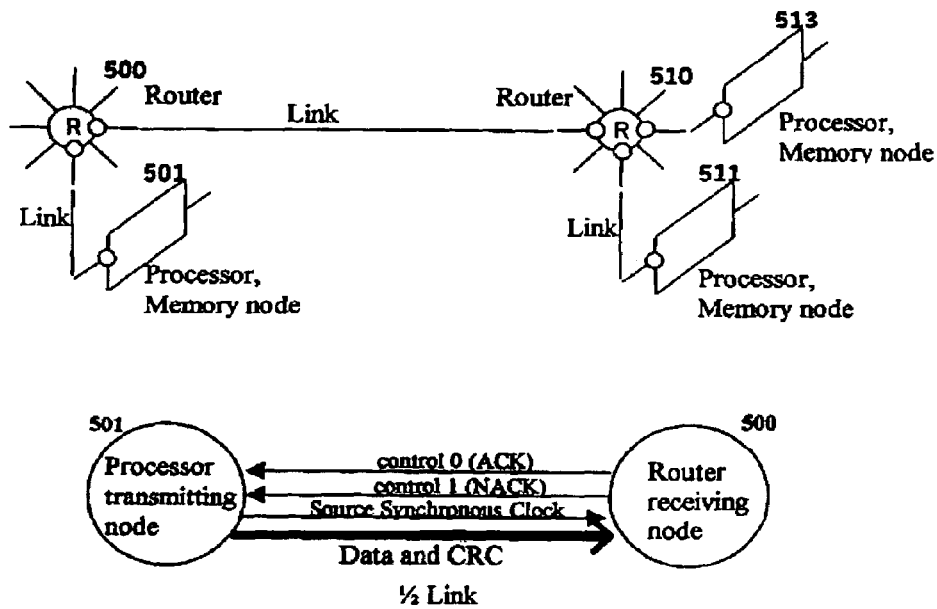
FIG. 5 is a block diagram showing the basic construct of a scalable server interconnect fabric.
Figures 6A, 6B:
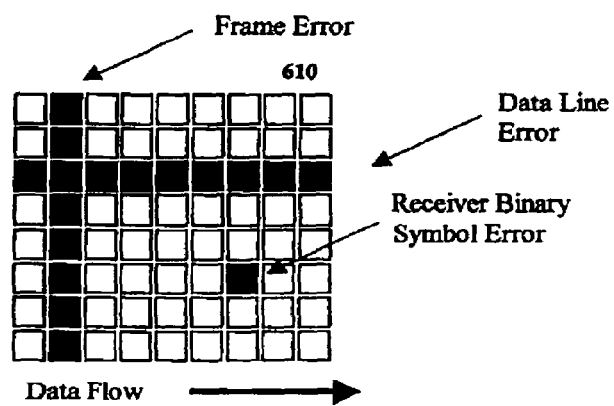
FIGS. 6A and B are diagrams showing a basic data packet format used for messaging and data transfers between processing nodes and the error modes inherent to packet transmission.
Figure 7:
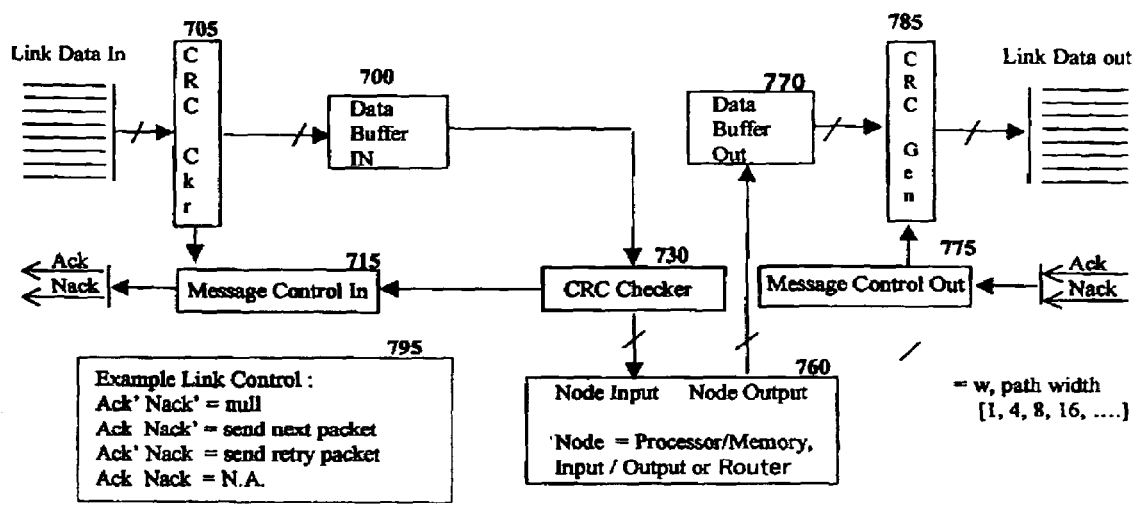
FIG. 7 is a block diagram showing the basic logic required in a messaging channel to implement an ARQ, Automatic Retry Request, algorithm.

Consider the simplified data packet of FIG. 6 with 8 bytes of data followed by a byte of CRC checkcode. FIG. 5 illustrates how data is moved from node to node on a link by link basis. This means that no bad data is transferred beyond where it is first detected to be in error. A forwarding node must therefore buffer the send data until signaled that the transfer finished successfully. If data arrives in error at a processor it will not be used or executed. A FIG. 6 data packet is transferred from processor node 501 to router node 500. If there is no error an acknowledge signal, ACK, is returned to the transmitting processor node. If an error is detected a negative acknowledge signal, NACK, is sent indicating that a retry is necessary. The scheme is nice in that no extra bandwidth or signal paths are expended during nominal error free conditions. Only the extra side-band NACK signal is overhead as the same data wires are used for the retried data. Bandwidth throughput is reduced to the extent of the frequency of the retry recovery operations. The principal drawback is that anything more than infrequent transient errors will degrade or down the link. FIG. 7 shows the logic blocks required at each node. FIG. 5 shows that at least one of these logic blocks would be required at each processor and eight at each router.

Consider the elements of FIG. 7. Data arrives from a transmitting node at item 705 where the data packet CRC is checked at line speed. A detected error will result in a signal being sent to the Message Control In logic block, item 715, indicating that a negative acknowledge (NACK) is the proper response to the transmitting node.

Once the data packet exits the CRC Checker, item 705, it is buffered in the Data Buffer In logic block, item 700. If no data packet CRC error is detected at the node input the buffered data packet can be moved into the node, item 760. Here again it is prudent to reverify the CRC as the data packet can possibly be corrupted in the buffering process. The data passes from data buffer, item 700 to the node, item 760, through the second CRC Checker, item 730. If a CRC error is detected the Message Control In logic block, item 715, is again signaled to reply to the transmitting node with a NACK signal. A CRC error occurring at either CRC Checker will flag the data packet to be in error at the node, item 760. If no CRC errors have been detected the Message Control In logic block, item 715 replies to the transmitting node with an Acknowledge signal.

Automatic Retry Request, ARQ, signal protocol for transient error correction causes the next data packet to be transferred upon reception of an ACK signal and a retry/resend of the previous data packet upon reception of a NACK signal. Consider the node output in closer detail. There is a Data Output Buffer, item 770, which buffers at least one two data packets followed by a CRC generator, item 780. A Message Control Out logic block, item 775 receives both ACK and NACK signals from the upstream node. As described above an ACK causes the next new data packet to be transmitted while a NACK will cause the Data Output Buffer, item 770, to resend the previous data packet. The circuit so far is only capable of retries effecting recovery of transient errors.

The explanation block 795 details the encoding of ACK and NACK signals. Effectively there is no special encoding at this level, an active ACK line translates as an ACK and an active NACK line translates as a NACK. Setting both ACK and NACK is not applicable and disallowed.

Figure 8:
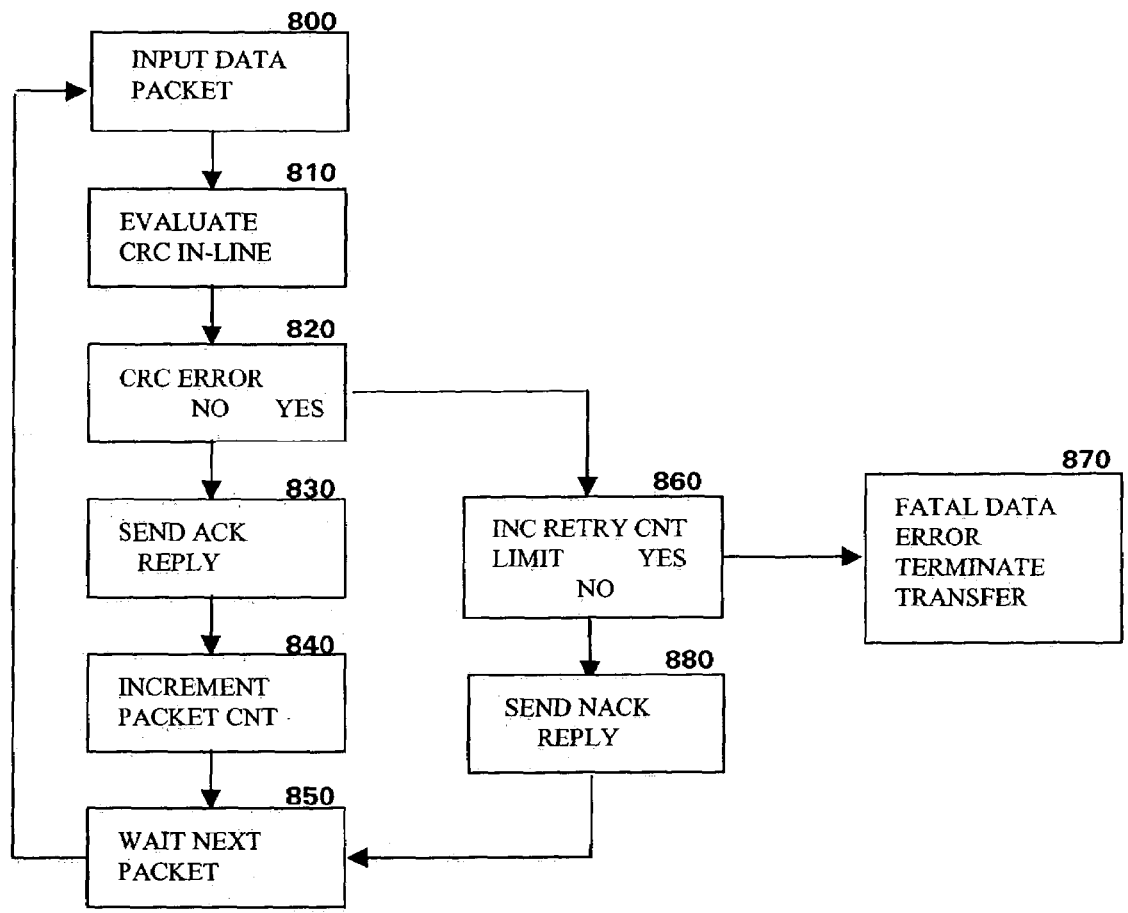
FIG. 8 is the basic flow chart for ARQ (automatic retry request) logic.

FIG. 8 is the flow chart for sending packets over the links using only ARQ retry recovery for transient errors. A conventional ARQ circuit is limited to a specific number of retries then either permits the receiver to accept bad data, flags the data in error, terminates the transfer or some combination of the three. Normally the transfer is simply terminated as noted.

Consider FIG. 8 in detail.

At step 800 a data packet is received at a node's input port.

Step 810 evaluates the data packet CRC sequentially at line speed.

At decision block 820 if there is a CRC error the process proceeds to step 860.

If there is no CRC error the process proceeds to step 830.

Step 860 increments a retry count and compares with a designated limit count.

If the retry limit has been reached the process exits to step 870 if not proceeds to step 880.

Process step 870 reports a fatal error, does not send either ACK or NACK and terminates the transfer.

Step 880 sends a NACK reply back to the transmitting node and proceeds to step 850.

Step 830 sends an Acknowledge to the transmitting node and proceeds to step 840.

Step 840 increments the packet count and proceeds to step 850.

Step 850 waits for the reception of the next packet and returns to step 800.

Consider the data packet [D], item 900 in FIG. 9. It is made up of eight data bytes followed by a CRC byte that covers all eight data bytes. Assume that an ACK signal has caused [D] to be to be transferred to a downstream node in a system such as sketched in FIG. 5. FIG. 10 shows the same data packet [D], item 1000, is received in error where byte 0 has picked bit 5 in transit. The CRC Checker at the receiving node detects this error. When all bytes have been received a NACK signal is returned by the Message Control In logic block, 1115, to the transmitting node indicating that the data packet CRC check failed at the receiving node. In response to the NACK signal the transmitting node assembles ECC packet [E] item 910. It is possible to resend the data packet using the boolean logic in FIG. 2 item 220 to translate data bytes to ECC bytes at the transmitting node. A CRC byte is appended. Assume that the line failure inverts bit line 5. Again bit 5 fails in transit this time dropping bit 5 of ECC byte 0 shown in FIG. 10 ECC packet, 1010. The receiving node now has both a bad data packet [D] 1000 residing in the Data Buffer logic block, 1100 and a bad ECC packet [E] 1010 residing in the ECC Buffer logic block, 1110. The example correction process is computed in the Error Corrector logic block 1130 per the algorithm shown in FIG. 10A. Each data/ECC byte pair (codeword) will attempt self-detection and self-correction. Up to two random bits in error can be corrected per codeword regardless of the length and format of the packet.

FIG. 10 shows that byte 0 of data packet [D] 1000 is received with bit 5 picked; '81' hexadecimal has become 'A1' hexadecimal. The ECC value for 'A1' is found by evaluation using the equations of FIG. 2C item 210 or from Table 2 as F'8' hexadecimal. The ECC packet [E] 1010 byte 0 read is '57' hexadecimal. Subtracting '57' hexadecimal from 'F8' hexadecimal using the binary exclusive-or operator we get the ECC syndrome 'AF' hexadecimal. From Table 5 which uses the generator polynomial $g1(x)=1+x^3+x^4+x^5+x^8$ we obtain the error pattern of d5 and e5. The table actually used by hardware, software or firmware would likely produce the binary error pattern of '20' hexadecimal for correction of just the data byte and ignoring the ECC byte. The error pattern is exclusive-or'ed with the data by toggling bit 5 back to the correct value of '81' hexadecimal.

Had the ECC packet [E] 1010 transferred;without error the CRC check would have determined this correctness. When this occurs it is advantageous to forward the ECC packet 1010 to the ECC to Data Converter logic block FIG. 11 item 1120 and simply translate the mirrored ECC bytes back to data bytes and proceed without invoking error correction.

FIG. 11 shows the link termination logic blocks of FIG. 5 modified to include the error correction block 1130, the ECC to data translation block 1120 and the data to ECC translation block 1180. Note that hardware systems would more likely use the equations in FIG. 2 than the lookup Table 2 to encode ECC bytes item 1180, and to translate ECC bytes back to data bytes, item 1120.

The Mux In logic block, FIG. 11 item 1125, has been added to multiplex input data from the Data Buffer, the ECC to Data Converter and the Error Corrector logic blocks. Lastly the data packet's CRC is reverified as before this time checking the results of all three possible input buffers, the ECC to Data Converter, the Error Corrector logic blocks and the Data Buffer. The node is now capable of correcting non-transient line errors using the codewords error correction capabilities.

The explanation block FIG. 11 item 1195 shows an example modification to the ACK/NACK protocol that encodes the two signals such that three actions can be requested and decoded. The ACK signal alone would request the next available data packet. The NACK signal alone requests the transmission of the data packet translated to an ECC packet. The combination of ACK and NACK signals can be decoded to request the previous data packet as the NACK signal did in the conventional ARQ approach.

Figure 12:
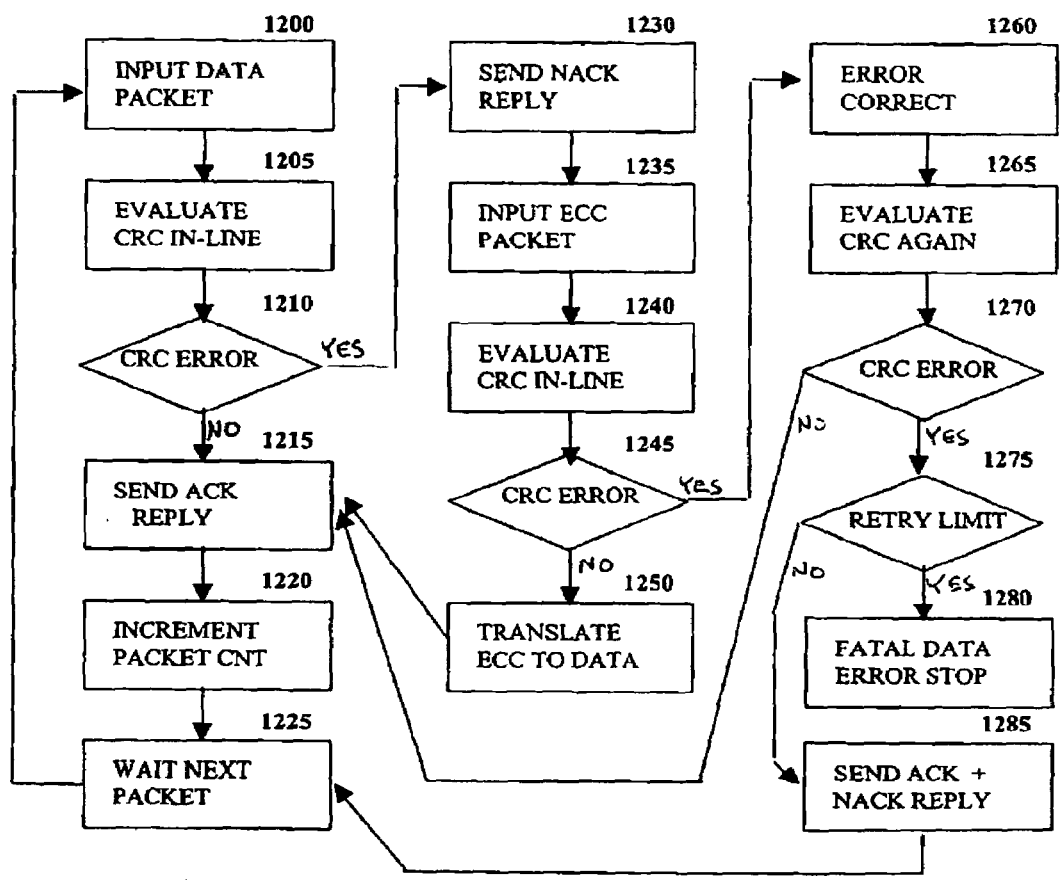
FIG. 12 is an ARQ flow chart of FIG. 8 modified to accomplish error correction on retry.

FIG. 12 is a flow chart of the above process utilizing the combination of ARQ retry algorithm together with the dual error correction capability and the ECC mirrored translation capability. With this capability permanent data line errors and many other errors that were previously fatal can now-be recovered.

The process flow depicted in FIG. 12 is based upon the flow depicted in FIG. 8 for ARQ without error correction. Consider FIG. 12 in detail.

At step 1210 if the CRC is-determined in error advance to step 1230.

At step 1230 a NACK reply is returned requesting an ECC retry packet for the previous data packet.

Step 1235 inputs the ECC retry packet.

Step 1240 evaluates the received ECC packet CRC.

If there is an ECC packet CRC error the process advances to step 1260.

If there is no ECC packet CRC error the ECC bytes are translated to data bytes and the process advances to step 1215.

Step 1215 sends an ACK reply back to the transmitter requesting the next data packet.

Step 1220 increments the data packet count and advances to step 1225.

Step 1225 waits for the next packet and returns to step 1200 to input the packet.

Step 1260 performs the error correction algorithm and advances to step 1265.

Step 1265 re-evaluates the ECC packet CRC after the error correction process.

If there is no CRC error at step 1270 after error correction advance to step 1215.

If there is a CRC error at step 1270 the process advances to step 1275.

Step 1275 increments the retry count and tests for limit reached.

If the limit has not been reached the process advances to step 1285.

If the limit has been reached the process advances to step 1280.

Step 1280 declares the packet unrecoverable.

Step 1285 sends ACK and NACK signals requesting a retry of the previous data packet then advances to step 1225.

It is an object of the invention to utilize both erasure recovery method and the random bit error correction capability providing solutions for systems that may be disposed to both erasure and error modes. Consider the data packet [D] 1300 in FIG. 13 that is encoded for data dispersal erasure recovery. Refer also to the codeword in binary array form depicted in FIG. 1 box 120. Note that in FIG. 13 the data packet [D] 1300 is made up of only "s" and "t" hexadecimal elements. Note that "s" and "t" elements make up original data bytes. Note also in FIG. 13 that-a corresponding ECC packet [E] 1301 is made up of only "u" and "v" hexadecimal elements. These "u" and "v" elements are the corresponding ECC bytes of the original data bytes. If brought together they make up complete codewords capable of error correction. Also recall that couplet "u v", the ECC, mirrors couplet "s t", the data byte.

Figure 15:
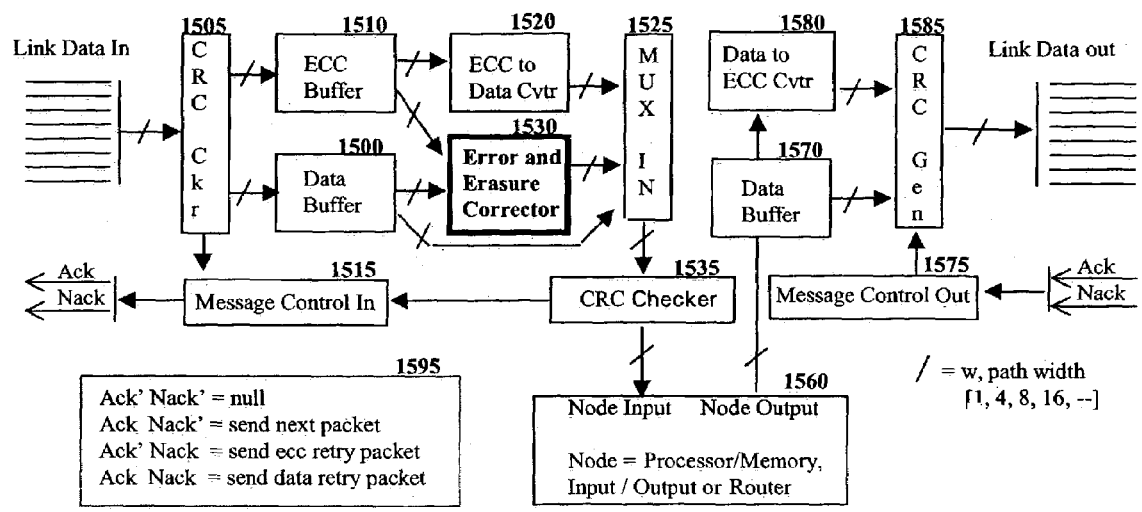
FIG. 15 is a block diagram showing the ARQ logic of FIG. 11 further modified to accomplish simultaneous erasure recovery and error correction.
Figure 16:
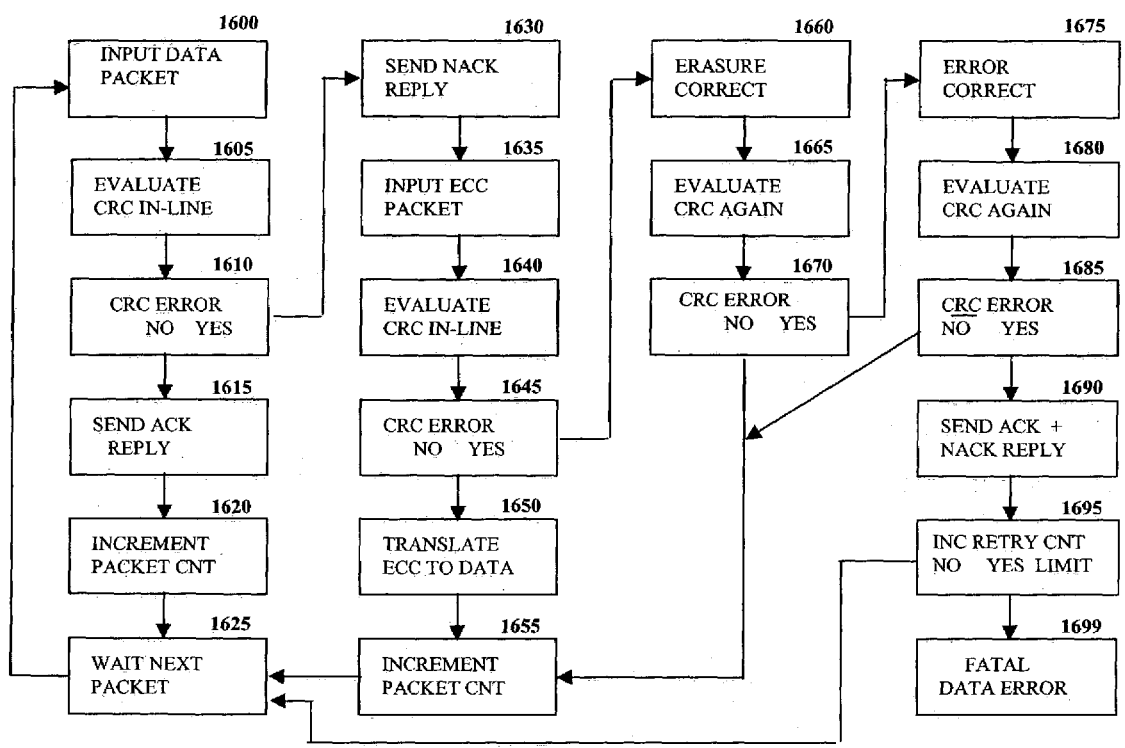
FIG. 16 is an ARQ flow chart of FIG. 12 modified to accomplish simultaneous erasure recovery and error correction.

More complex packet formats that support the erasure recovery method can also support error correction. Note in FIG. 13 that the corresponding "u" and "v" ECC data is shifted to rows (data lines) four lines offset from the "s" and "t" data lines. By doing this, multiples of data lines can fail solid with data being recovered by the erasure recovery method. FIG. 14 shows the "s" portion of data byte 00 being in error and the corresponding u portion of ECC byte 00 also being in error. Just as in the previous example of error correction once both packets are brought together error self-detection and self-correction can be effected. FIG. 15 shows FIG. 11 modified slightly to encompass both error correction and erasure recovery. The single logic block 1530 is modified to include erasure recovery logic. FIG. 16 is the modified flow chart for an example algorithm that first recovers erasures then applies error correction. It some cases, such as where data or devices may not be missing as erasure assumes but remains available but seriously in error, it may be best to apply error correction first then evaluate CRC status and then possibly make a decision regarding erasure recovery after correction has been applied. In either case erasure recovery and error correction is done as in the previous embodiments. For erasure recovery two error free data streams are identified via the CRC status among the four transmitted elements followed by equation evaluation or table look-up method of the missing elements, "s" and/or "t". This flexibility to make either-or recovery choices within processing and storage systems is the goal of autonomic self-healing systems.

Consider the FIG. 16 flow chart. Only three new process blocks have been added to the flow chart of FIG. 12 which deals with error correction as the only recovery choice. As with the procedure in FIG. 12 a retry request of the ECC version of the data packet is first tried in process steps 1630, 1635 and 1640. If there is no CRC error then a simple translation of ECC bytes to data bytes completes the recovery process. If the ECC packet contained CRC errors over the data of interest the process advances to step 1660 and attempts erasure recovery if the "t" and "v" elements are available without CRC errors. The process advances to step 1665 and the CRCs are re-verified. If there still exists CRC errors the process advances to step 1675 where the error correction approach can be tried. If there are no CRC errors after erasure recovery the data is assumed correct and the process continues at step 1655.

So far the preferred embodiment has shown data dispersed within a packet on a single link. It is also an object of the invention to disperse data across multiple physical links. Data dispersed across multiple links can be reassembled, validated, error corrected and if necessary recovered by the erasure methods. This would be applicable for dispersed storage data or data transmitted across computer system fabrics as pictured in FIG. 17.

Figure 17:
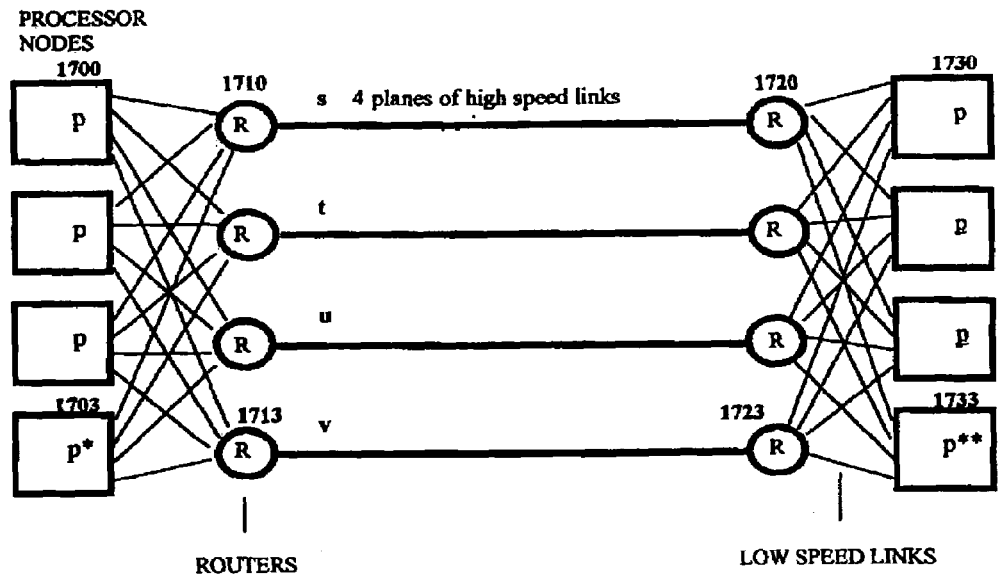
FIG. 17 is a block diagram showing a four plane server system interconnect fabric that uses erasure recovery and error correction to accomplish fail-safe resiliency and data integrity validation.

Refer again to the codeword in binary array form as in box 120 of FIG. 1. For example consider the rows s, t, u and v for dispersal. Data packets can be formatted for dispersal in hexadecimal elements as previously explained. This accomplishes two things in a system of four router planes as shown in FIG. 17. First it spreads the bandwidth across more than a single plane. The total amount of data has doubled but the amount of data per plane is halved and resiliency is increased. Any two of four planes can fail and the system will continue to run at full speed. When there are no erasure failures, data can be validated on a byte-by-byte basis. It is possible to transmit only specific application data in this manner if data validation is the more highly sought requirement as is common in financial systems. It is also possible to send data across all four planes then use only the first two that arrive at the receiving node. Also if validation is the goal then sending data bytes over one plane and ECC bytes over a second plane provides the receiver a chance to utilize the full power of the code to verify data integrity and make random error correction as necessary.

Referring now to FIG. 18, thereshown is a two dimensional array of codeword arrays using the method and structure of the present invention. Here, each data byte is encoded twice and each set of error correction codes is stored in a separate array. This leads to a multidimensional array of codewords as shown in FIG. 18.

Referring now to FIG. 19, thereshown is flowchart of process for encoding codeword arrays. After starting at block 300, a Message Byte Count is set to zero in block 305. Next, at block 310, a Next Data Byte [D] is retrieved. Then, at block 315, Table 1 is addressed with Data Byte [D] and a codeword is loaded. An optional step of generating separate Cyclic Redundancy Check (CRC) for each Data Byte may be performed at block 320. Then, at block 325, data buffers are aggregated for dispersion of the packet across multiple channels (here 4). The Message Byte Count is then incremented at block 330. The process then determines at block 335 whether an entire message has been encoded. If no, the process cycles back to block 310. If yes, the process determines whether a CRC is to be performed at block 340. This process is optional. If no CRC is to be performed, the process stops at block 345. If a CRC is to be performed, the process continues on at block 350 by encoding CRC bytes in the same manner as the data bytes in block 350. Table 1 is then addressed with the CRC byte and loaded with a codeword array at block 355. Again, data buffers are aggregated for dispersion of the codeword array elements across multiple channels in block 360. The CRC count is then incremented in block 365 and the process determines if it has reached the end of the CRC process. If not, the process loops back to block 350. If so, the process ends at block 375.

Referring now to FIG. 20, thereshown is a flowchart of the process for decoding code word packets. This would occur, in a four channel system, where two or three of the four channels have been read successfully and one or two of the channels are missing, in error or delayed. The data from two good channels must be assembled into a byte in the form of an ordered pair of column codeword array elements as noted above: wx, wy, wz, xy, xz or yz. The process begins at block 400 and moves to block 405 where count, called Message Byte is set to zero. Then, the process assembles the codeword array elements at block 410. Table 2 is then addressed with the assembled codeword array element pair and input from Table 2 at block 415. At block 420, the process masks for the proper column codeword array element field and the data byte that is read from the table is stored in a read buffer. The Message Byte Count is then incremented at block 425. If the end of the message has been reached, then the process ends at block 435. Otherwise, the process loops back to block 410.

Referring now to FIG. 21, thereshown is a flowchart,of the process of reconstructing a disk drive data sector. Here, one or two disk drives have failed and the replacement(s) have been reconfigured, or "hot swapped" into the array of drives. The following process is used to construct a new sector to replace the missing data from the failed unit(s) for the new, empty units. The corresponding data from the two good drive sectors must first be assembled into bytes in the form of an ordered pair of column codeword array elements. After starting at block 500, the process reads a corresponding sector from any two good drives and assembles the data in the form of codeword array element pairs at block 505. Next, a count called Byte Count, is set to zero at block 510. At block 515, column codeword array element pairs are assembled. Next, at block 520, the each assembled column codeword array element pair is used to address Table 2 and the corresponding data byte is read from the table. Then at block 525, the data byte is used to look up the codeword from Table 1 and the mask needed for the missing column codeword array elements for reconstruction. The one or two missing codeword array elements are then saved in the one or two appropriate number of sector write buffers. The Byte count is then incremented at block 530. If the end of a sector is reached at block 535, then at block 540, the reconstructed one or two sectors is written on a hot swapped drive and the process ends at block 545. Otherwise, the process loops back to block 515. The same exact process is used for dispersal of row codeword array elements. The row dispersal algorithm uses Tables 3 and 4. Designs implemented in boolean logic would use the equations in place of software or hardware tables.

All patents, patent applications and printed publications heretofore cited in the present application are incorporated herein by reference.

The foregoing has been a description of a novel and non-obvious data encoding and decoding method and apparatus. The description provided is give as an example of the invention and is not intended as a limitation of the invention. The applicant describes the scope of his invention through the claims appended hereto.

What is claimed is:

1. A method of encoding a data byte, comprising the steps of:
    selecting an irreducible polynomial;
    generating an error control code as a function of the polynomial and the data; and generating an encoded data matrix wherein the data and the error control code comprise the elements of the matrix;
    dispersing an element of the encoded data matrix to a selected one of a plurality of channels based upon a position of the element in the matrix.

2. The method of claim 1, wherein:
    the error control code is the same length as the data byte.

3. The method of claim 2, wherein the data is digitally represented by eight bits and further wherein:
    the polynomial is selected as an eighth degree polynomial.

4. The method of claim 3, wherein the polynomial is in the form of $1+x^3+x^4+x^5+x^8$.

5. The method of claim 3, wherein the polynomial is in the form of $1+x+x^2+x^4+x^6+x^7+x^8$.

6. The method of claim 1, wherein the error control code is generated by dividing the data by the polynomial, the error control code being the remainder modulo the polynomial.

7. The method of claim 1, wherein six pair combinations of row elements can be equated to a data row element pair.

8. The method of claim 1, wherein six pair combinations of column elements can be equated to a data row element pair.

9. The method of claim 1, wherein pair combinations of elements can be equated to any other pair of elements.

10. The method of claim 1, comprising the further steps of forming a second error control code of two additional row elements, whereby further pair combination of row elements can be equated to all but three other combinations of row elements.

11. The codeword of claim 1 wherein each codeword element is sent to a separate device.

12. A method of encoding data in the form of a data byte $Di=d0d1d2d3d4d5d6d7$ comprising the steps of:
    selecting an irreducible error correcting eighth degree polynomial; dividing the data byte by the polynomial to produce an error correction code in the form $Ei=e0e1e2e3e4e5e6e7$; and
    generating an encoded data word in the form $d0d1d2d3d4d5d6d7e0e1e2e3e4e5e6e7$.

13. The method of claim 12, wherein the polynomial is in the form of
    $1=x^3+x^4+x^5+x^8$.

14. The method of claim 12, wherein the polynomial is in the form of
    $1+x+x^2+x^4+X^6+x^7+x^8$.

15. The method of claim 12, wherein the error control code is generated by dividing the data by the polynomial, the error control code being the remainder modulo the polynomial: and generating an encoded data word in the form d0 d1 d2 d3 d4 d5 d6 d7
e0 e1 e2e3e4e5 e6e7.

16. The method of claim 12, comprising the further step of:
forming the encoded data word as an array.

17. The method of claim 16, wherein multiple data bytes are encoded and formed as encoded data words, the encoded data words being formed into an array of arrays.

18. The method of claim 17, further comprising:
forming a error detection code for every element in the rows and columns of the array of arrays.

19. The method of claim 18, wherein error recovery is desired and is accomplished by the further steps of:
counting errors in a codeword in a column;
counting errors in a codeword in a row;
using column equations to correct errors if the number of column errors is less than row errors;
using row equations otherwise.

20. The method of claim 18, wherein error recovery is desired and is accomplished by the further steps of:
counting errors in a codeword in a column;
counting errors in a codeword in a row;
using row equations to correct errors if the number of row errors is less than or equal to column errors;
using column equations otherwise.

21. The method of claim 16, comprising the further sten of:
forming the encoded data word as a 4×4 array.

22. The method of claim 16, comprising the further step of:
forming the encoded data word as a 3×4 array.

23. The method of claim 16, comprising the further step of:
forming the encoded data word as a 4×3 array.

24. The method of claim 16, comprising the further step of:
arranging the matrix so that each element of the data byte is horizontally or vertically adjacent to at least three other elements of the data byte.

25. The method of claim 16, comprising the further step of:
arranging the matrix so that each element of the data byte and the error control byte is a row of the matrix.

26. The method of claim 16, comprising the further step of:
forming the encoded data matrix as
d0d1d2d3
d4d5d6d7
e0e1e2e3
e4e5e6e7.

27. The method of claim 26, comprising the further steps of:
dispersing the first row of the matrix to a first device;
dispersing the second row of the matrix to a second device;
dispersing the third row of the matrix to a third device;
dispersing the fourth row of the matrix to a fourth device; and
dispersing each column of the matrix to one of the first through fourth devices such that only one column from the matrix is stored on any of the first through fourth storage devices.

28. The method of claim 27, wherein in the event that up to two of the devices fails, a method of recovenng lost data includes the step of:
determining which of the first through fourth devices that has not failed and contains error correction codes for data on a device that has failed;
retrieving the dispersed combination of error correction codes and data from the device so selected;
recreating data dispersed to a failed device using the known data and error correction codes in the equations below to recreate lost data
e0=d0+d1+d3+d6
e1=d0+d2+d3+d4+d6+d7
e2=d0+d4+d5+d6+d7
e3=d1+d5+d6+d7
e4=d0+d1+d3+d7
e5=d1+d2+d3+d4
e6=d0+d1+d2+d4+d5+d6
e7=d0+d2+d5+d7.

29. The method of claim 28, wherein in the event that up to two of the devices fail, a method of recovering lost data includes the step of:
determining which of the first through fourth devices that has not failed and contains error correction codes for data on a device that has failed;
retrieving the dispersed combination of error correction codes and data from the device so selected;
recreating data dispersed to a failed device using the known data and error correction codes using the equations to recreate lost data when
decoding with inputs s and u rows available,
d0=d0
d1=d1
d2=d2
d3=d3
d4=d0+d1+e2+e3
d5=d2+d3+e1+e2
d6=d0+d1+d3+e0
d7=d0+d2+e0+e1+e2+e3
decoding with inputs s and v rows available,
d0=d0
d1=d1
d2=d2
d3=d3
d4=d1+d2+d3+e5
d5=d1+d3+e4+e7
d6=d0+d1+e4+e5+e7
d7=d0+d1+d2+d3+e4;
decoding with inputs t and u rows available,
d0=d4+d5+d6+d7+e2
d1=d5+d6+d7+e3
d2=d4+d5+d6+e0e3
d3=d4+d6+e0+e2e3
d4=d4
d5=d5
d6=d5
d7=d7;
decoding with inputs t and v rows available
d0=d4+d7+e4+e5
d1=d4+d6+d7+e6+e7
d2=d4+d5+e4+e5+e7
d3=d4+d5+d6+d7+e4+e6
d4=d4
d5=d5
d6=d6
d7=d7; or
decoding with inputs u and v rows available,
d0=e0+e2+e5+e7
d1=e1+e2+e3+e5+e6+e7
d2=e3+e4+e5+e6 d3=e0+e4+e5+e6e7
d4=e0+e1+e2+e6
d5=e0+e1+e2+e3e7
d6=e0+e1+e3+e4e5e7
d7=e1+e4+e6+e7.

30. The method of claim 28, wherein in the event that up to two of the devices fails, a method of recovering lost data includes the step of:
determining which of the first through fourth devices that has not failed and contains error correction codes for data on a device that has failed; retrieving the dispersed combination of error correction codes and data from the device so selected;
recreating data dispersed to a failed device using the known data and error correction codes using the equations to recreate lost data when
decoding with inputs w and x columns available,
d0=d0
d1=d1
d2=d0+d1+e0+e1+e4+e5
d3=d0+d4+e0+e1+e4
d4=d4
d5=d5
d6=d1+d4+e1+e4
d7=d0+d4+e4+e5;
decoding with inputs w and y columns available,
d0=d0
d1=d6+e0+e2+e4+e6
d2=d2
d3=d0+e2+e4+e6
d4=d4
d5=d0+d2+d4+e0+e2+e4
d6=d6
d7=d2+d6+e0+e4;
decoding with inputs w and z columns available,
d0=d0
d1=d0+d7+e0+e3+e4+e7
d2=d3+e0+e3+e7
d3=d3
d4=d4
d5=d0+d3+d7+e0+e3
d6=d3+e3+e4+e7
d7=d7;
decoding with inputs x and y columns available,
d0=d2+d6+e1+e2+e5+e6
d1=d1
d2=d2
d3=d2+d5+e1+e2
d4=d1+d5+e1+e2+e5
d5=d5
d6=d6
d7=d1+d2+e2+e6;
decoding with inputs x and z columns available,
d0=d5+e1+e3+e5
d1=d1
d2=d7+e1+e3+e5+e7
d3=d3
d4=d1+d3+d7+e1+e3+e7
d5=d5
d6=d1+d5+d7+e3
d7=d7; or
decoding with inputs y and z columns available,
d0=d6+d7+e2+e3+e6+e7
d1=d2+d7+e2+c6
d2=d2
d3=d3
d4=d2+d6+e2+e7 d5=d2+d6+e2+e3+e6
d6=d6
d7=d7.

31. The method of claim 27 wherein in the event that up to two of the devices fails, a method of recovering lost data includes the step of:
determining which of the first through fourth devices that has not failed and contains error correction codes for data on a device that has failed;
retrieving the dispersed combination of error correction codes and data from the device so selected;
recreating data dispersed to a failed device using the known data and error correction codes in the equations below to recreate lost data
e0=d0+d3+d4+d5+d6
e1=d1+d4+d5+d6+d7
e2=d2+d5+d6+d7
e3=d0+d4+d5+d7
e4=d0+d1+d3+d4
e5=d0+d1+d2+d3+d6
e6=d1+d2+d3+d4+d7
e7=d2+d3+d4+d5.

32. The method of claim 31, wherein in the event that up to two of the devices fails, a method of recovering lost data includes the step of:
determining which of the first through fourth devices that has not failed and contains error correction codes for data on a device that has failed;
retrieving the dispersed combination of error correction codes and data from the device so selected;
recreating data dispersed to a failed device using the known data and error correction codes using the equations to recreate lost data when:
decoding with inputs s and u rows available,
d0=d0
d1=d1
d2=d2
d3=d3
d4=d1+d2+e1+e2
d5=d2+d3+e0+e2+e3
d6=d0+d1+e1+e3
d7=d0+d1+d3+e0+e1;
decoding with inputs s and v rows available,
d0=d0
d1=d1
d2=d2
d3=d3
d4=d0+d1+d3e4
d5=d0+d2+e4e7
d6=d0+d1+d2+d3e5
d7=d0+d2+e4+e6;
decoding with inputs t and u rows available,
d0=d4+d5+d7+e3
d1=d4+d5+d6+d7+e1
d2=d5+d6+d7+e2
d3=d6+d7+e0+e3
d4=d4
d5=d5
d6=d5
d7=d7;
decoding with inputs t and v rows available
d0=d4+d6+d7+e5+e6
d1=d5+d7+e6+e7
d2=d4+d6+e4+e5
d3=d5+d6+e4+e5+e7
d4=d4
d5=d5 d6=d6
d7=d7; or
decoding with inputs u and v rows available,
d0=e2+e3+e4+5
d1=e0+e3+e4+e5+e6
d2=e1+e4+e5+e6+e7
d3=e3+e4+e6+e7
d4=e0+e2+e3+e7
d5=e0+e1+e2+e5
d6=e0+e1+e2+e3+e6
d7=e1+e2+e3+e4'e7.

33. The method of claim 31, wherein in the event that up to two of the devices fails, a method of recovering lost data includes the step of:
  determining which of the first through fourth devices that has not failed and contains error correction codes for data on a device that has failed;
  retrieving the dispersed combination of error correction codes and data from the device so selected;
  recreating data dispersed to a failed device using the known data and error correction codes using the equations to recreate lost data when
  decoding with inputs w and x columns available,
  d0=d0
  d1=d1
  d2=d1+d4+d5+e0+e5
  d3=d0+d1+d4+e4
  d4=d4
  d5=d5
  d6=d1+d5+e0+e4
  d7=d4+e0+e1+e4;
  decoding with inputs w and y columns available,
  d0=d0
  d1=d0+e0+e2+e6
  d2=d2
  d3=d4+e0+e2+e4e6
  d4=d4
  d5=d0+d6+e2+e4e6
  d6=d6
  d7=d0+d2+e4+e6;
  decoding with inputs w and z columns available,
  d0=d0
  d1=d0+d3+d4+e4
  d2 d0+d3+d7+e3+e7
  d3=d3
  d4=d4
  d5=d0+d4+d7+e3
  d6=d3+d7+e0+e3
  d7=d7;
  decoding with inputs x and y columns available,
  d0=d1+d5+e1+e5+e6
  d1=d1
  d2=d2
  d3=d2+d5+d6+e1+e6
  d4=d1+d2+e1+e2
  d5=d5
  d6=d6
  d7=d2+d5+d6+e2;
  decoding with inputs x and z columns available,
  d0=d7+e1+e5+e7
  d1=d1
  d2=d3+e1+e3e5
  d3=d3
  d4=d5+e1+e3+e5e7
  d5=d5
  d6=d1+d7+e3+e5+e7
  d7=d7; or
  decoding with inputs y and z columns available,
  d0=d2+d3+d7+e3+e7
  d1=d2+d6+e2+e6+e7
  d2=d2
  d3=d3
  d4=d3+d6+d7+e2+e7
  d5=d2+d6+d7+e2
  d6=d6
  d7=d7.

34. A method of encoding a data byte, comprising the steps of:
  selecting an irreducible polynomial;
  generating a first error control code as a function of the polynomial and the data;
  generating a second error control code as a function of the polynomial and the data;
  generating an encoded first data matrix wherein the data and the first error control codes comprise the elements of the matrix;
  generating an encoded second data matrix wherein the data and the first and second error control codes comprise elements of the matrix; and
  dispersing an element of the encoded data matrix to a selected one of a plurality of channels based upon a position of the element in the matrix.

* * * * *

UNITED STATES PATENT AND TRADEMARK OFFICE
CERTIFICATE OF CORRECTION

PATENT NO. : 7,103,824 B2  
APPLICATION NO. : 10/624208  
DATED : September 5, 2006  
INVENTOR(S) : Robert Halford Page 1 of 1

It is certified that error appears in the above-identified patent and that said Letters Patent is hereby corrected as shown below:

Col. 26, line 26, after "claim" delete "l" and insert --1--.
Col. 26, line 61, delete "I=$x^3+x^4+x^5+x^8$." and insert --I+$x^3+x^4+x^5+x^8$.--.
Col. 26, line 64, delete "1+$x+x^2+x^4+X^6+x^7+x^8$" and insert --1+$x+x^2+x^4+x^6+x^7+x^8$--.
Col. 27, line 4, delete "e0 e1 e2e3e4e5 e6e7" and insert --e0 e1 e2 e3 e4 e5 e6 e7--.
Col. 27, line 28, after "further" please delete "sten" and insert --step--.
Col. 27, line 66, after "method of" delete recovenng" and insert -- recovering--.
Col. 28, line 13, after "d1" please insert --d2--.
Col. 28, line 49, after "e0" please insert --+--; line 50, after "e2" please insert --+--.
Col. 28, line 53, delete "d5" and insert --d6--.
Col. 29, line 1, after "e6" please insert --+--; line 3, after "e3" please insert --+--; line 4, after "e4" please insert --+--; line 4, after "e5" please insert --+--.
Col. 29, line 64, delete "c6" and insert --e6--.
Col. 30, line 4, after "27" insert --,--.
Col. 30, line 48, after "d3" insert --+--; line 49, delete "d5=d0+d2+e4e7" and insert --d5=d0+d1+d2+e4+e7--.
Col. 30, line 50, after "d3" please insert --+--.
Col. 30, line 59, delete "d5" and insert --d6--.
Col. 31, line 4, delete "5" please insert --e5--.
Col. 31, line 11, after "e4" please delete """ and insert --+--.
Col. 31, line 36, after "e4" please insert --+--; line 38, after "e4" please insert --+--.
Col. 32, line 15, after "e3" please insert --+--; line 17, after "e5"please insert --+--.

Signed and Sealed this

Fifth Day of August, 2008

JON W. DUDAS  
*Director of the United States Patent and Trademark Office*